United States Patent
Wilcox et al.

(10) Patent No.: US 9,255,686 B2
(45) Date of Patent: Feb. 9, 2016

(54) MULTI-LENS LED-ARRAY OPTIC SYSTEM

(75) Inventors: Kurt S. Wilcox, Libertyville, IL (US); Bernd Keller, Santa Barbara, CA (US); Ted Lowes, Lompoc, CA (US); Peter S. Andrews, Durham, NC (US); Christopher Strom, Racine, WI (US)

(73) Assignee: Cree, Inc., Durham, NC (US)

( * ) Notice: Subject to any disclaimer, the term of this patent is extended or adjusted under 35 U.S.C. 154(b) by 268 days.

(21) Appl. No.: 13/441,540

(22) Filed: Apr. 6, 2012

(65) Prior Publication Data

US 2012/0307503 A1 Dec. 6, 2012

Related U.S. Application Data

(63) Continuation-in-part of application No. 12/475,194, filed on May 29, 2009, now Pat. No. 8,348,475, and a continuation-in-part of application No. 13/021,496, filed on Feb. 4, 2011, now Pat. No. 9,035,328.

(51) Int. Cl.
| | |
|---|---|
| *F21V 5/00* | (2015.01) |
| *F21V 7/00* | (2006.01) |
| *F21V 5/04* | (2006.01) |
| *F21V 13/02* | (2006.01) |
| *G02B 19/00* | (2006.01) |
| *F21W 131/103* | (2006.01) |
| *F21Y 101/02* | (2006.01) |

(Continued)

(52) U.S. Cl.
CPC . *F21V 5/04* (2013.01); *F21V 5/008* (2013.01); *F21V 7/0091* (2013.01); *F21V 13/02* (2013.01); *G02B 19/0014* (2013.01); *G02B 19/0028* (2013.01); *G02B 19/0057* (2013.01); *G02B 19/0066* (2013.01); *F21W 2131/103* (2013.01); *F21Y 2101/02* (2013.01); *F21Y 2105/001* (2013.01); *H01L 25/0753* (2013.01); *H01L 33/54* (2013.01); *H01L 2924/0002* (2013.01)

(58) Field of Classification Search
CPC ........... G02B 19/0014; G02B 19/0057; G02B 19/0066

See application file for complete search history.

(56) References Cited

U.S. PATENT DOCUMENTS

| | | |
|---|---|---|
| 1,004,585 A | 10/1911 | Mulholland et al. |
| 1,024,695 A | 4/1912 | Mulholland |

(Continued)

FOREIGN PATENT DOCUMENTS

| | | |
|---|---|---|
| EP | 1107210 A2 | 6/2001 |
| GB | 2282700 A | 4/1995 |

(Continued)

OTHER PUBLICATIONS

Future Lighting Solutions "the 6 Steps to LED Lighting Success" brochure. Date: undated. 6 pages.

*Primary Examiner* — Elmito Breval
(74) *Attorney, Agent, or Firm* — Jannson Munger McKinley & Kirby Ltd.

(57) ABSTRACT

Lighting apparatus having a first lens over the LED emitter and a second lens over the first lens, and including: a first optical surface which is a first-lens outer surface configured to refract light from the emitter; a second optical surface which is a second-lens inner surface spaced from the first optical surface; and a third optical surface which is a second-lens outer surface configured to refract light from the second optical surface toward a preferential side. One embodiment includes asymmetric primary and secondary lenses.

84 Claims, 20 Drawing Sheets

(51) Int. Cl.
*F21Y 105/00* (2006.01)
*H01L 25/075* (2006.01)
*H01L 33/54* (2010.01)

(56) References Cited

U.S. PATENT DOCUMENTS

| | | |
|---|---|---|
| 1,404,004 A | 1/1922 | Benford |
| 1,535,486 A | 4/1925 | Lundy |
| 2,007,033 A | 7/1935 | Williams |
| 2,212,876 A | 8/1940 | Chauvet |
| 2,254,961 A | 9/1941 | Harris |
| 2,544,413 A | 3/1951 | Bouwers |
| 2,802,097 A | 8/1957 | Franck |
| 4,254,453 A | 3/1981 | Mouyard et al. |
| 4,336,580 A | 6/1982 | Mouyard et al. |
| 4,345,308 A | 8/1982 | Mouyard et al. |
| 4,474,437 A | 10/1984 | Gorenstein |
| 4,537,474 A | 8/1985 | Astero |
| 4,561,736 A | 12/1985 | Furter et al. |
| 4,650,998 A | 3/1987 | Martin |
| 4,738,516 A | 4/1988 | Verhoeven et al. |
| 4,767,172 A | 8/1988 | Nichols et al. |
| 4,845,600 A | 7/1989 | Matsumura et al. |
| 4,862,330 A | 8/1989 | Machida et al. |
| 4,935,665 A | 6/1990 | Murata |
| 4,941,072 A | 7/1990 | Yasumoto |
| 5,001,609 A | 3/1991 | Gardner et al. |
| 5,013,144 A | 5/1991 | Silverglate |
| 5,014,165 A | 5/1991 | Naganawa |
| 5,062,027 A | 10/1991 | Machida et al. |
| 5,125,153 A | 6/1992 | Frey et al. |
| 5,127,728 A | 7/1992 | Warren |
| 5,140,220 A | 8/1992 | Hasegawa |
| 5,174,649 A | 12/1992 | Alston |
| RE34,254 E | 5/1993 | Dragoon |
| 5,289,082 A | 2/1994 | Komoto |
| 5,302,778 A | 4/1994 | Maurinus |
| 5,309,277 A | 5/1994 | Deck |
| 5,349,504 A | 9/1994 | Simms |
| 5,592,578 A | 1/1997 | Ruh |
| 5,784,209 A | 7/1998 | Manabe et al. |
| 5,813,743 A | 9/1998 | Naka |
| 5,813,752 A | 9/1998 | Singer et al. |
| 5,865,529 A | 2/1999 | Yan |
| 5,894,195 A | 4/1999 | McDermott |
| 5,894,196 A | 4/1999 | McDermott |
| 5,898,267 A | 4/1999 | McDermott |
| 5,924,788 A | 7/1999 | Parkyn |
| 5,939,996 A | 8/1999 | Kniveton |
| 5,995,291 A | 11/1999 | Togino |
| 6,033,087 A | 3/2000 | Shozo et al. |
| 6,229,160 B1 | 5/2001 | Krames et al. |
| 6,244,727 B1 | 6/2001 | Ryan, Jr. et al. |
| 6,250,787 B1 | 6/2001 | Matubara |
| 6,273,596 B1 | 8/2001 | Parkyn, Jr. |
| 6,274,924 B1 | 8/2001 | Carey et al. |
| 6,283,613 B1 | 9/2001 | Schaffer |
| 6,296,376 B1 | 10/2001 | Kondo et al. |
| 6,323,063 B2 | 11/2001 | Krames et al. |
| 6,356,395 B1 | 3/2002 | Tawa et al. |
| 6,361,190 B1 | 3/2002 | McDermott |
| 6,361,192 B1 | 3/2002 | Fussell et al. |
| 6,443,594 B1 | 9/2002 | Marshall et al. |
| 6,473,238 B1 | 10/2002 | Daniell |
| 6,481,130 B1 | 11/2002 | Wu |
| 6,498,355 B1 | 12/2002 | Harrah et al. |
| 6,502,956 B1 | 1/2003 | Wu |
| 6,504,301 B1 | 1/2003 | Lowery |
| 6,541,800 B2 | 4/2003 | Barnett et al. |
| 6,547,423 B2 | 4/2003 | Marshall et al. |
| 6,550,940 B2 | 4/2003 | Kamiya et al. |
| 6,554,451 B1 | 4/2003 | Keuper |
| 6,560,038 B1 | 5/2003 | Parkyn, Jr. et al. |
| 6,570,190 B2 | 5/2003 | Krames et al. |
| 6,598,998 B2 | 7/2003 | West et al. |
| 6,601,962 B1 | 8/2003 | Ehara et al. |
| 6,607,286 B2 | 8/2003 | West et al. |
| 6,616,299 B2 | 9/2003 | Martineau |
| 6,637,921 B2 | 10/2003 | Coushaine |
| 6,679,621 B2 | 1/2004 | West et al. |
| 6,682,211 B2 | 1/2004 | English et al. |
| 6,721,101 B2 | 4/2004 | Daniell |
| 6,730,940 B1 | 5/2004 | Steranka et al. |
| 6,808,293 B2 | 10/2004 | Watanabe et al. |
| 6,837,605 B2 | 1/2005 | Reill |
| 6,846,101 B2 | 1/2005 | Coushaine |
| 6,851,835 B2 | 2/2005 | Smith |
| 6,896,381 B2 | 5/2005 | Benitez et al. |
| 6,903,376 B2 | 6/2005 | Shen et al. |
| 6,918,677 B2 | 7/2005 | Shipman |
| 6,924,943 B2 | 8/2005 | Minano et al. |
| 6,929,384 B2 | 8/2005 | Watanabe et al. |
| 6,948,838 B2 | 9/2005 | Kunstler |
| 6,948,840 B2 | 9/2005 | Grenda et al. |
| 6,955,451 B2 | 10/2005 | Coushaine et al. |
| 6,987,613 B2 | 1/2006 | Pocius et al. |
| 6,991,355 B1 | 1/2006 | Coushaine et al. |
| 6,995,402 B2 | 2/2006 | Ludowise et al. |
| 7,009,213 B2 | 3/2006 | Camras et al. |
| 7,021,797 B2 | 4/2006 | Minano et al. |
| 7,042,021 B2 | 5/2006 | Isoda |
| 7,053,419 B1 | 5/2006 | Camras et al. |
| 7,063,441 B2 | 6/2006 | Kramer et al. |
| 7,063,450 B2 | 6/2006 | Ehara et al. |
| 7,064,355 B2 | 6/2006 | Camras et al. |
| 7,080,932 B2 | 7/2006 | Keuper |
| 7,106,523 B2 | 9/2006 | McLean et al. |
| 7,111,972 B2 | 9/2006 | Coushaine et al. |
| 7,114,838 B2 | 10/2006 | Wu |
| 7,118,236 B2 | 10/2006 | Hahm et al. |
| 7,118,262 B2 | 10/2006 | Negley |
| 7,121,691 B2 | 10/2006 | Coushaine et al. |
| 7,125,143 B2 | 10/2006 | Hacker |
| 7,125,160 B2 | 10/2006 | Wong et al. |
| 7,150,553 B2 | 12/2006 | English et al. |
| 7,153,000 B2 | 12/2006 | Park et al. |
| 7,153,002 B2 | 12/2006 | Kim et al. |
| 7,172,324 B2 | 2/2007 | Wu et al. |
| 7,181,378 B2 | 2/2007 | Benitez et al. |
| 7,182,497 B2 | 2/2007 | Lee et al. |
| 7,213,945 B2 | 5/2007 | Yoneda et al. |
| 7,227,703 B2 | 6/2007 | Chen |
| 7,246,923 B2 | 7/2007 | Conner |
| 7,246,931 B2 | 7/2007 | Hsieh et al. |
| 7,334,918 B2 | 2/2008 | Newton et al. |
| 7,649,209 B2 | 1/2010 | Hussell et al. |
| 7,674,018 B2 | 3/2010 | Holder et al. |
| 7,709,853 B2 | 5/2010 | Medendorp, Jr. |
| 7,733,488 B1 | 6/2010 | Johnson |
| 7,766,509 B1 | 8/2010 | Laporte |
| 7,766,530 B2 | 8/2010 | Hwang et al. |
| 7,821,023 B2 | 10/2010 | Yuan et al. |
| 7,829,899 B2 | 11/2010 | Hutchins |
| 7,854,536 B2 | 12/2010 | Holder et al. |
| 7,866,837 B2 | 1/2011 | Ho |
| 7,874,703 B2 | 1/2011 | Shastry et al. |
| 7,887,197 B2 * | 2/2011 | Iwanaga ........................... 353/94 |
| 7,901,098 B2 | 3/2011 | Saitoh et al. |
| 7,922,369 B2 | 4/2011 | Condon et al. |
| 7,922,370 B2 | 4/2011 | Zhang et al. |
| 7,942,558 B2 | 5/2011 | Zweig et al. |
| 8,092,051 B2 | 1/2012 | Helbing |
| 2002/0067549 A1 | 6/2002 | Tawa et al. |
| 2003/0099115 A1 | 5/2003 | Reill |
| 2004/0037076 A1 | 2/2004 | Katoh et al. |
| 2004/0114355 A1 | 6/2004 | Rizkin et al. |
| 2005/0073849 A1 | 4/2005 | Rhoads et al. |
| 2005/0083699 A1 | 4/2005 | Rhoads et al. |
| 2005/0086032 A1 | 4/2005 | Benitez et al. |
| 2005/0179041 A1 | 8/2005 | Harbers et al. |
| 2005/0205878 A1 | 9/2005 | Kan |
| 2005/0224826 A1 | 10/2005 | Keuper et al. |
| 2005/0281047 A1 | 12/2005 | Coushaine et al. |
| 2006/0013000 A1 | 1/2006 | Coushaine et al. |

(56) References Cited

U.S. PATENT DOCUMENTS

| | | |
|---|---|---|
| 2006/0013002 A1 | 1/2006 | Coushaine et al. |
| 2006/0034082 A1 | 2/2006 | Park et al. |
| 2006/0039143 A1 | 2/2006 | Katoh et al. |
| 2006/0067640 A1 | 3/2006 | Hsieh et al. |
| 2006/0082999 A1 | 4/2006 | Klein |
| 2006/0083000 A1 | 4/2006 | Yoon et al. |
| 2006/0102914 A1 | 5/2006 | Smits et al. |
| 2006/0105482 A1 | 5/2006 | Alferink et al. |
| 2006/0181902 A1 | 8/2006 | Tamura et al. |
| 2006/0186431 A1 | 8/2006 | Miki et al. |
| 2006/0238881 A1 | 10/2006 | Park et al. |
| 2008/0297020 A1 | 12/2008 | Wanninger et al. |
| 2009/0050907 A1 | 2/2009 | Yuan et al. |
| 2009/0050908 A1 | 2/2009 | Yuan et al. |
| 2009/0052192 A1 | 2/2009 | Kokubo et al. |
| 2009/0086498 A1 | 4/2009 | Condon et al. |
| 2009/0108281 A1 | 4/2009 | Keller et al. |
| 2009/0161360 A1* | 6/2009 | Li et al. .......... 362/235 |
| 2009/0283787 A1 | 11/2009 | Donofrio et al. |
| 2009/0290360 A1 | 11/2009 | Wilcox et al. |
| 2010/0001296 A1 | 1/2010 | Hamanaka et al. |
| 2010/0014286 A1 | 1/2010 | Yoneda et al. |
| 2010/0039810 A1 | 2/2010 | Holder et al. |
| 2010/0073927 A1 | 3/2010 | Lewin et al. |
| 2010/0085763 A1 | 4/2010 | Aguglia |
| 2010/0085764 A1 | 4/2010 | Chuang |
| 2010/0110695 A1 | 5/2010 | Nakamura |
| 2010/0128488 A1 | 5/2010 | Marcoux et al. |
| 2010/0135028 A1 | 6/2010 | Kokubo |
| 2010/0238669 A1 | 9/2010 | Holder et al. |
| 2010/0302786 A1 | 12/2010 | Wilcox et al. |
| 2010/0328941 A1 | 12/2010 | Zhang et al. |
| 2011/0001149 A1 | 1/2011 | Chan et al. |
| 2011/0026247 A1 | 2/2011 | Zhang |
| 2011/0110098 A1 | 5/2011 | Fu |
| 2011/0164425 A1 | 7/2011 | Chen |
| 2011/0204261 A1 | 8/2011 | Dahm et al. |
| 2011/0291131 A1 | 12/2011 | Ito |
| 2012/0051047 A1 | 3/2012 | Lu et al. |
| 2012/0199852 A1 | 8/2012 | Lowes et al. |
| 2012/0307503 A1 | 12/2012 | Wilcox et al. |
| 2013/0092960 A1 | 4/2013 | Wilcox et al. |

FOREIGN PATENT DOCUMENTS

| | | |
|---|---|---|
| JP | 60199746 | 10/1985 |
| JP | 61160328 | 7/1986 |
| JP | 61-185980 | 8/1986 |
| JP | 61-214485 | 9/1986 |
| JP | 8264839 | 10/1996 |
| WO | WO 9950596 A2 | 10/1999 |
| WO | WO 0024062 A1 | 4/2000 |
| WO | WO 2006111805 A1 | 10/2006 |
| WO | WO 2007018927 A2 | 2/2007 |
| WO | WO 2008144672 A1 | 11/2008 |

* cited by examiner

MULTI-LENS LED-ARRAY OPTIC SYSTEM

RELATED APPLICATION

This application is a continuation-in-part of patent application Ser. No. 12/475,194, filed May 29, 2009, and patent application Ser. No. 13/021,496, filed Feb. 4, 2011, both currently pending. The contents of the parent applications are incorporated herein by reference.

FIELD OF THE INVENTION

This invention relates generally to the field of LED lighting apparatus and, more particularly, to the field of LED-based optical systems for use in LED lighting fixtures for which there are particular light-distribution requirements, such as what is sometimes referred to as preferential-side light distribution—for roadway light fixtures and the like.

BACKGROUND OF THE INVENTION

In recent years, the use of light-emitting diodes (LEDs) for various common lighting purposes has increased, and this trend has accelerated as advances have been made in LEDs, LED arrays, and specific components. Indeed, lighting applications which previously had typically been served by fixtures using what are known as high-intensity discharge (HID) lamps are now being served by LED lighting fixtures. Such lighting applications include, among a good many others, roadway lighting, factory lighting, parking lot lighting, and commercial building lighting.

In many of such products, achieving high levels of illumination over large areas with specific light-distribution requirements is particularly important. One pertinent example is fixtures for roadway lighting, an application in which the fixtures are generally placed along roadway edges while light distribution is desired along a significant portion of roadway length and, of course, on the roadway itself—generally to the exclusion of significant light off the roadway.

Providing roadway light from light fixtures along the roadway may be referred to as "preferential-side" illumination. In such situations it is desirable to minimize the use of large complex reflectors and/or varying orientations of multiple light sources to achieve desired illumination patterns. Achieving preferential-side illumination, or other desired illumination patterns, by means of LED-based optical systems, particularly without resorting to large complex reflectors or other complex means is highly desirable.

SUMMARY OF THE INVENTION

The present invention is a multi-lens LED-array optical system and improved LED-based lighting apparatus which satisfies all of the above-noted objects and purposes.

One aspect of this invention is a lighting apparatus for preferential-side illumination from an LED light emitter having an axis, the apparatus having a first lens over the emitter and a second lens over the first lens, the first and second lenses having certain characteristics. The invention includes optical surfaces as follows: (1) a first optical surface which is a first-lens outer surface configured to refract light from the emitter; (2) a second optical surface which is a second-lens inner surface spaced from the first optical surface and having (a) a refracting portion surrounding the first optical surface and including front and back sectors configured differently from one another, and (b) a reflecting portion around the back sector, the reflecting portion positioned to receive light refracted by the back sector for total internal reflection (TIR) toward the preferential side; and (3) a third optical surface which is a second-lens outer surface configured to refract light from the second optical surface toward the preferential side.

In certain embodiments, the first lens is configured such that the first optical surface refracts LED-emitted light toward the preferential side. In some of such embodiments, the first optical surface is shaped for refraction of LED-emitted light toward the preferential side, while in others of such embodiments, the first optical surface has a centerline offset from the emitter axis toward the preferential side. In embodiments of the latter type, the first optical surface may be shaped for refraction of LED-emitted light toward the preferential side.

In certain embodiments, the front sector of the refracting portion of the second optical surface has a substantially smooth surface configuration extending to the juncture of the front and back sectors. In such situations, it is preferred that the back sector of the refracting portion of the second optical surface include at least a pair of surface portions transverse to each other.

In some embodiments, the back sector of the refracting portion of the second optical surface includes at least a pair of surface portions transverse to each other.

In some embodiments, the emitter includes an LED light source that includes a submount having an LED-populated area which has an aspect ratio greater than 1, and an array of LEDs on the LED-populated area, and the first lens is on the submount over the LED-populated area. The aspect ratio may be at least about 1.25, or even at least about 1.5, and even as much as at least about 2. The LED-populated area is preferably rectangular.

As used herein, the term "LED-populated area" means an area (i.e., an area on the submount) the outer boundaries of which include the outermost edges of the outermost LEDs (of the LED array) in any direction. As used herein, the term "aspect ratio" means the ratio of the maximum cross-dimension of the LED-populated area to the maximum of the cross-dimensions orthogonal thereto.

As used herein, the term "emitter axis" means the line orthogonal to the plane defined by the LED-populated area and passing through the geometric center of the minimum-area rectangle bounding the LED-populated area, i.e., the center of the rectangle of minimum area which includes all of the LED-populated area.

Another aspect of this invention is lighting apparatus for preferential-side illumination, that includes: (1) a plurality of arrays of light-emitting diodes (LEDs) spaced along a circuit board, each array having first and second maximum cross-dimensions orthogonal to one another, the first maximum cross-dimension being greater than the second maximum cross-dimension, and each LED array defining a light-emission axis; (2) a plurality of first lenses each over a corresponding array of LEDs, each first lens having an outer surface configured to refract light from its corresponding LED array; and (3) a plurality of second lenses each spaced over a corresponding one of the first lenses, each second lens having (a) an inner surface configured to direct light toward the preferential side from its corresponding first-lens outer surface, and (b) an outer surface configured to refract light toward the preferential side from the inner surface.

In such embodiments, each first lens preferably refracts LED-emitted light toward the preferential side. In some of such embodiments, each first lens is shaped for refraction of LED-emitted light toward the preferential side. In others of such embodiments, the outer surface of each first lens has a centerline offset from the corresponding light-emission axis toward the preferential side; in these embodiments, the outer surface of the first lens directs LED-emitted light toward the preferential side.

In most embodiments of this invention, each first lens may be overmolded over its corresponding LED array, forming what is sometimes referred to as an LED package.

In certain embodiments, the plurality of LED arrays are mounted on a common submount. In certain other embodiments, the LED array is on a submount and each of the submounts is mounted on the circuit board.

In certain embodiments, the plurality of second lenses are portions of a one-piece lensing member.

Referring again to the LED-populated areas, the spacing and arrangement of the LEDs on each LED-populated area may be such that the total LED area is at least about one-third of the LED-populated area. More specifically, the spacing and arrangement of the LEDs may be such that the total LED area is at least about two-thirds of the LED-populated area, or even as much as at least about 90% of the LED-populated area.

As used herein, the term "total LED area" means the sum of the submount areas immediately beneath each of the LEDs of the LED array.

In certain embodiments, the spacing between LEDs of the array is no more than about 1 millimeter (mm), or as little as no more than about 0.5 mm, or in some cases no more than about 0.1 mm. In some instances, the spacing is no more than about 0.075 mm, and even no more than about 0.05 mm.

Another aspect of this invention is a lighting apparatus comprising (1) a plurality of arrays of light-emitting diodes (LEDs) spaced along a circuit board, each array having first and second maximum cross-dimensions orthogonal to one another, the first maximum cross-dimension being greater than the second maximum cross-dimension, and each LED array defining a light-emission axis; (2) a plurality of first lenses each over a corresponding array of LEDs, each first lens having an outer surface configured to refract light from its corresponding LED array; and (3) a plurality of second lenses each spaced over a corresponding one of the first lenses, each second lens having an inner surface and an outer surface which is configured to refract light from the inner surface.

As already noted, the plurality of LED arrays may be mounted to a submount, each to a common submount or, more particularly, each LED on its own submount, with each of the submounts being mounted on the circuit board. And, as noted, each first lens may be overmolded over each LED array. And, as also noted above, the plurality of second lenses may be portions of a one-piece lensing member.

Another aspect of this invention is a lighting apparatus for preferential-side illumination, the apparatus including an LED light emitter having an axis, comprising: (1) a first lens over the emitter and configured to direct LED-emitted light toward the preferential side; and (2) a second lens spaced over the first lens and configured to further direct the light toward the preferential side.

In certain of such embodiments, the first lens will have an outer surface configured to direct LED-emitted light toward the preferential side. In others of such embodiments, the first lens has a centerline which is offset from the emitter axis toward the preferential side, and the first lens may have an outer surface configured to direct LED-emitted light toward the preferential side.

Still another aspect of this invention is a lighting apparatus including (1) a plurality of arrays of LEDs spaced along a circuit board, each array having first and second maximum cross-dimensions orthogonal to one another, the first maximum cross-dimension being greater than the second maximum cross-dimension, and each LED array defining a light-emission axis; and (2) a plurality of lenses each over a corresponding array of LEDs, each lens having an outer surface configured to refract light from its corresponding LED array.

Yet another aspect of this invention is a lighting apparatus including (1) an LED light source including a submount having an LED-populated area which has an aspect ratio greater than 1, the LED-populated area having an array of LEDs thereon, (2) a first lens on the submount over the LED array and having an outer surface configured to refract light from the LED array, and (3) a second lens spaced over the first lens, the second lens having an inner surface and an outer surface which is configured to refract light from the inner surface.

Another aspect of this invention is lighting apparatus for preferential-side illumination, the apparatus including an LED light source with an axis and having an asymmetric primary lens over the LED light source and an asymmetric secondary lens spaced over the primary lens.

The term "asymmetric," as used herein with respect to lenses, when unmodified by any further limiting description, refers to a lens shape which is not rotationally symmetric about any axis perpendicular to its base plane. Types of asymmetric lenses include without limitation bilaterally symmetric lenses.

In descriptions of the invention, including in the claims below, the terms "comprising," "including" and "having" (each in their various forms) and the term "with" are each to be understood as being open-ended, rather than limiting, terms.

DETAILED DESCRIPTION OF CERTAIN EMBODIMENTS

FIGS. 1-26 illustrate a multi-lens LED-array optical system of an improved LED-based lighting apparatus.

Figure 1:
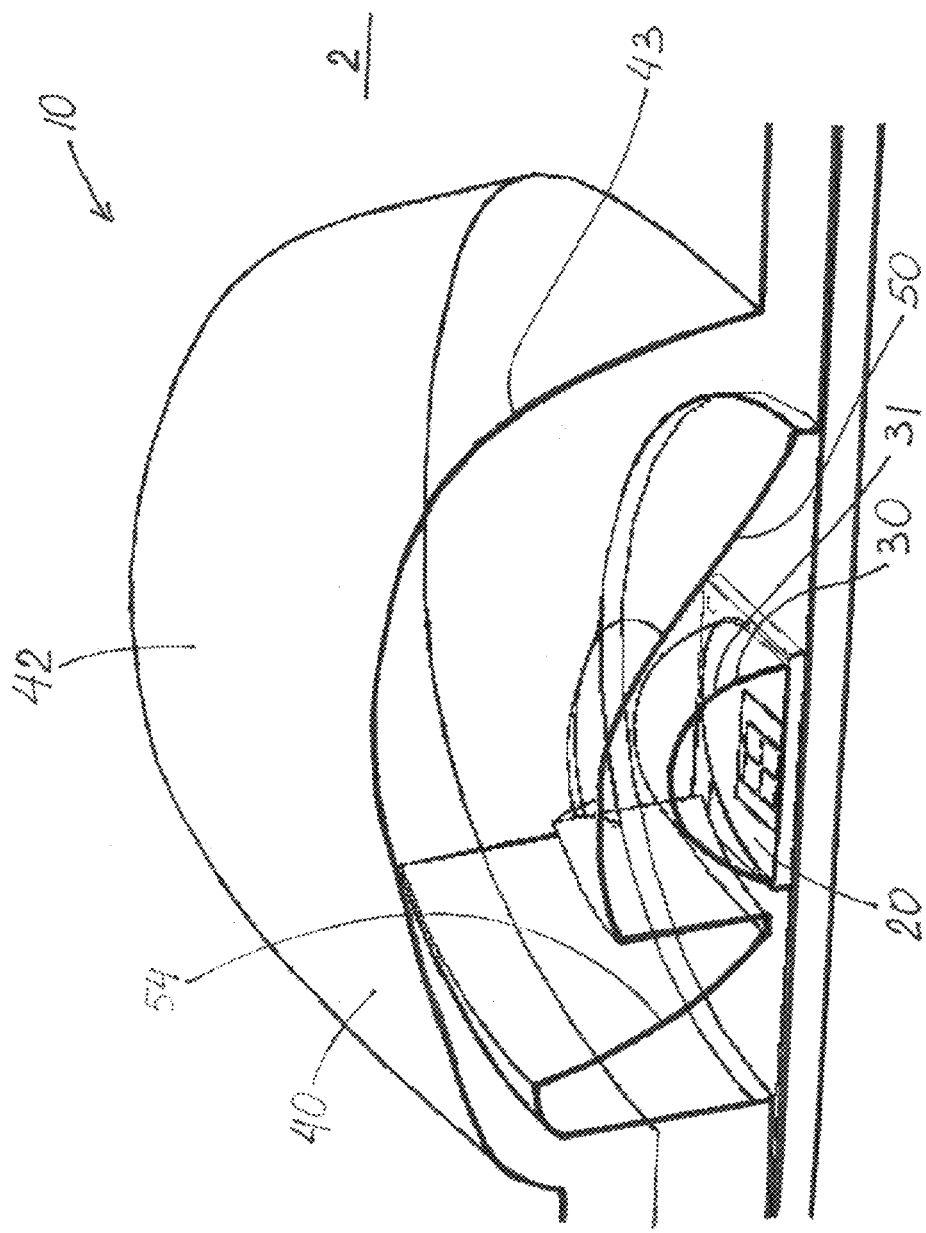
FIG. 1 is an enlarged cross-sectional perspective view of one embodiment of the inventive lighting apparatus.

FIG. 1 shows lighting apparatus 10 for illumination toward a preferential side 2 from an LED light emitter 20 having an axis 21. Lighting apparatus 10 has a first lens 30 over emitter 20 and a second lens 40 over first lens 30. The first lens is also sometimes referred to as a "primary" lens; and the second lens is also sometimes referred to as a "secondary" lens. Lighting apparatus 10 includes a first optical surface 31, a second optical surface 50 and a third optical surface 43. First optical surface 31 is an outer surface 32 of first lens 30 and is configured to refract light from emitter 20. Second optical surface 50 is an inner surface 41 of second lens 40. Second optical surface 50 is spaced from first optical surface 31 and has a refracting portion 51 and a reflecting portion 54, as best seen in FIGS. 1, 2, 13 and 14 and 19-25.

Figure 2:
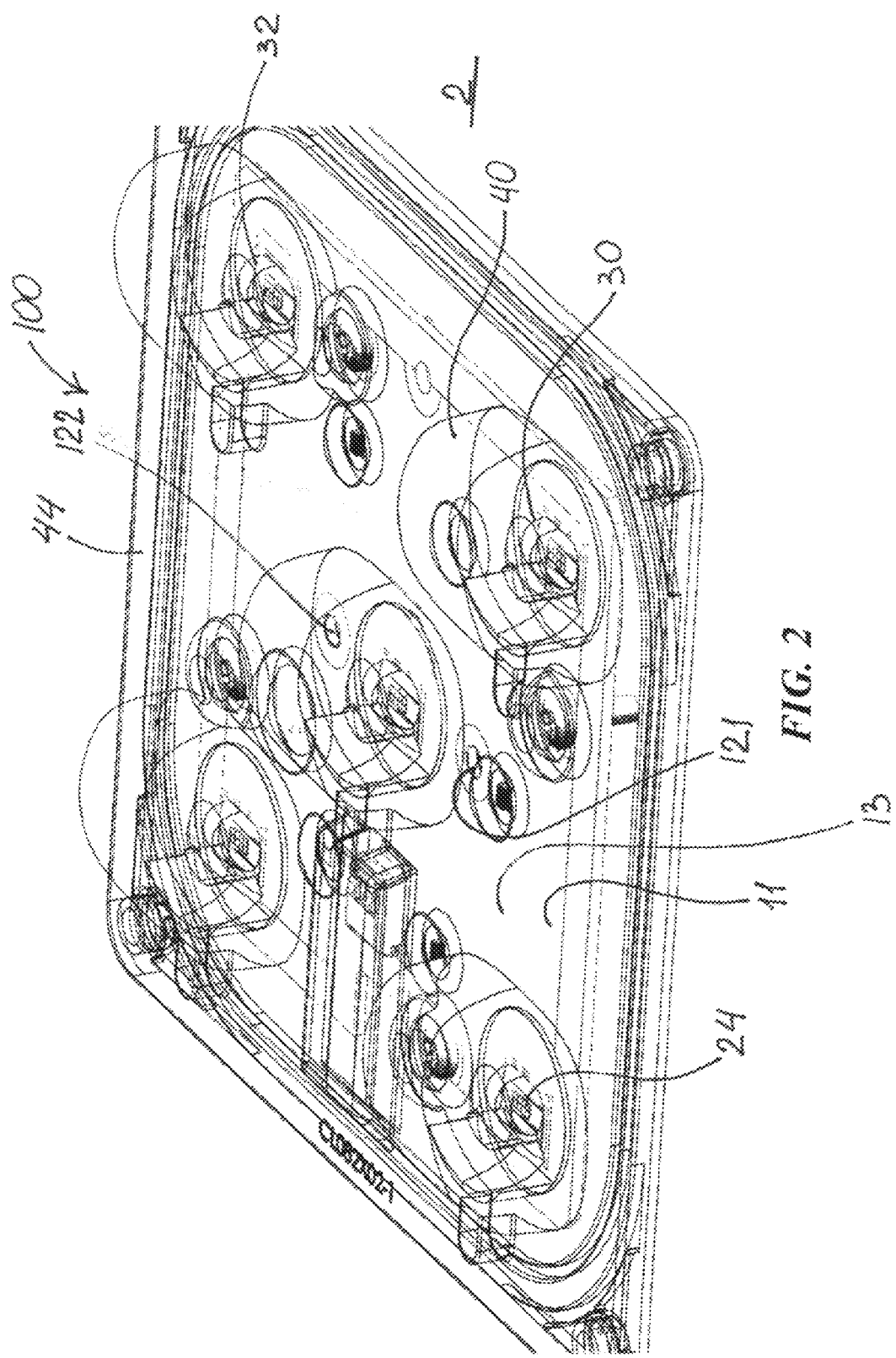
FIG. 2 is a perspective view of the lighting apparatus including a plurality of the optical systems of FIG. 1.
Figure 19:
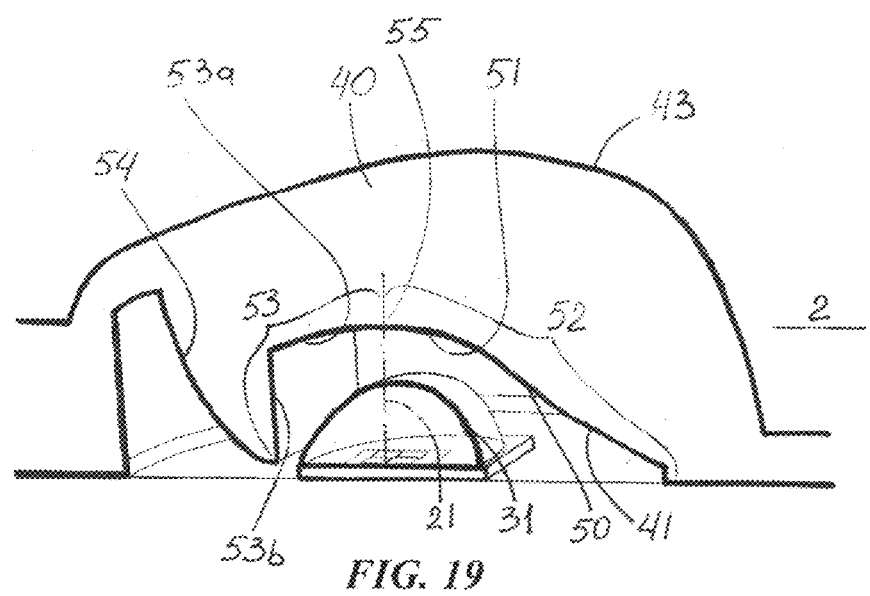
FIG. 19 is an enlarged non-transparent cross-sectional side view of the optical system of FIG. 1.

FIGS. 1, 2 and 19 best show refracting portion 51 surrounding first optical surface 31 and including front sector 52 and back sector 53 configured differently from one another. Reflecting portion 54 is around back sector 53 and is positioned to receive light refracted by the back sector 53 for total internal reflection (TIR) toward the preferential side 2. It is seen in FIGS. 1, 2 and 13-25 that third optical surface 43 is a second-lens outer surface 42 configured to refract light from second optical surface 50 toward the preferential side 2.

FIGS. 1-7 illustrate first lens 30 as configured such that first optical surface 31 refracts LED-emitted light toward preferential side 2. FIGS. 1-5 show first optical surface 31 shaped for refraction of LED-emitted light toward the preferential side 2. FIGS. 3-7 show first optical surface 31 having a centerline 33 offset from emitter axis 21 toward preferential side 2. FIGS. 1-5 show LED emitters 20 which have both first optical surface 31 having its centerline 33 offset from emitter axis 21 toward preferential side 2 and also being shaped for refraction of LED-emitted light toward preferential side 2.

FIGS. 1, 13, 14 and 19 best illustrate that front sector 52 of refracting portion 51 of second optical surface 50 has a substantially smooth surface configuration extending to juncture 55 of front and back sectors 52 and 53. It is also seen in these FIGURES that back sector 53 includes a pair of surface portions 53a and 53b transverse to each other.

FIGS. 3-12 show that emitter 20 includes an LED light source that includes a submount 22 having an array of LEDs 24 on an LED-populated area 23 which has an aspect ratio greater than 1. LED-populated area 23 also has a first maximum cross-dimension 15 and a second maximum cross-dimension 16 orthogonal to one another, first maximum cross-dimension 15 being greater than second maximum cross-dimension 16.

Figure 3:
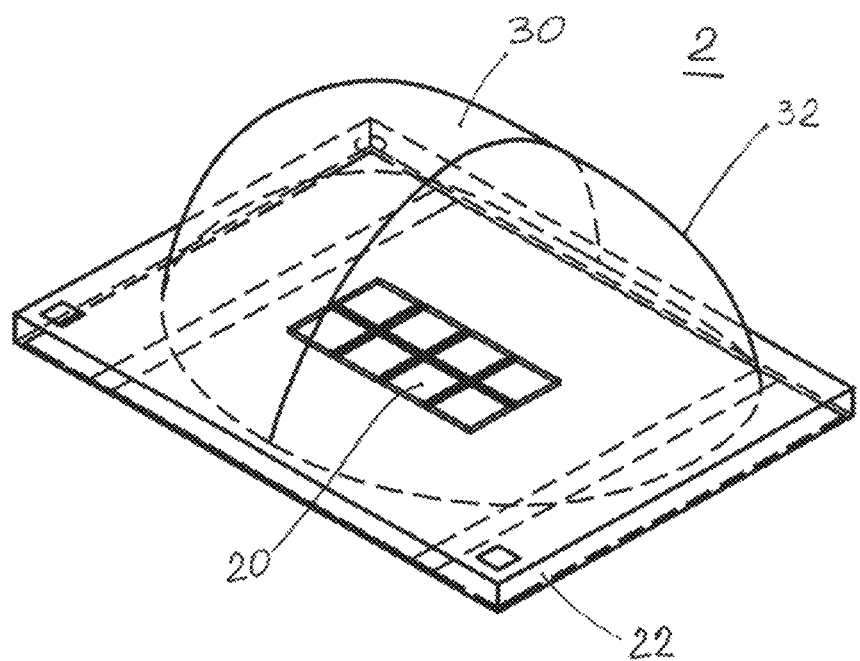
FIG. 3 is an enlarged perspective view of an embodiment of the inventive LED package including an array of eight LEDs and an asymmetric primary lens overmolded over the LED array.
Figure 4:
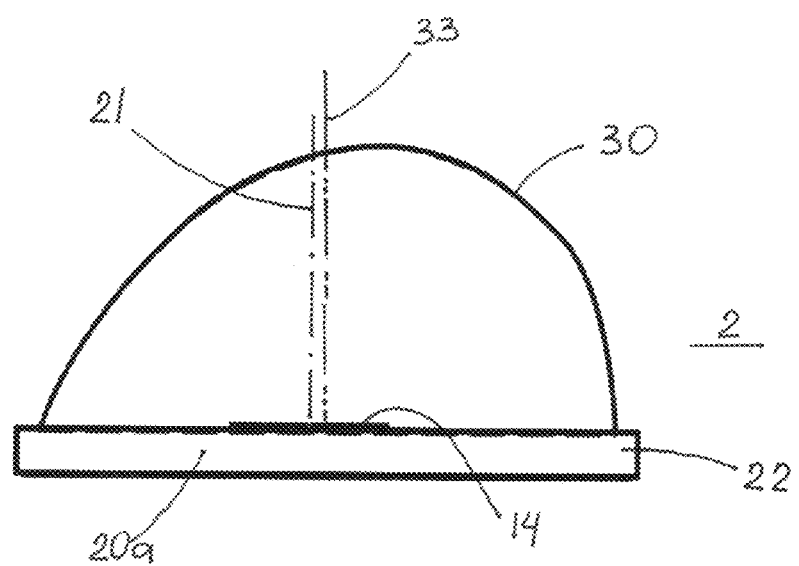
FIG. 4 is a cross-sectional side view of the LED package of FIG. 3.

FIGS. 3 and 4 best show first lens 30 on submount 22 and overmolded over LED-populated area 23.

Figure 5:
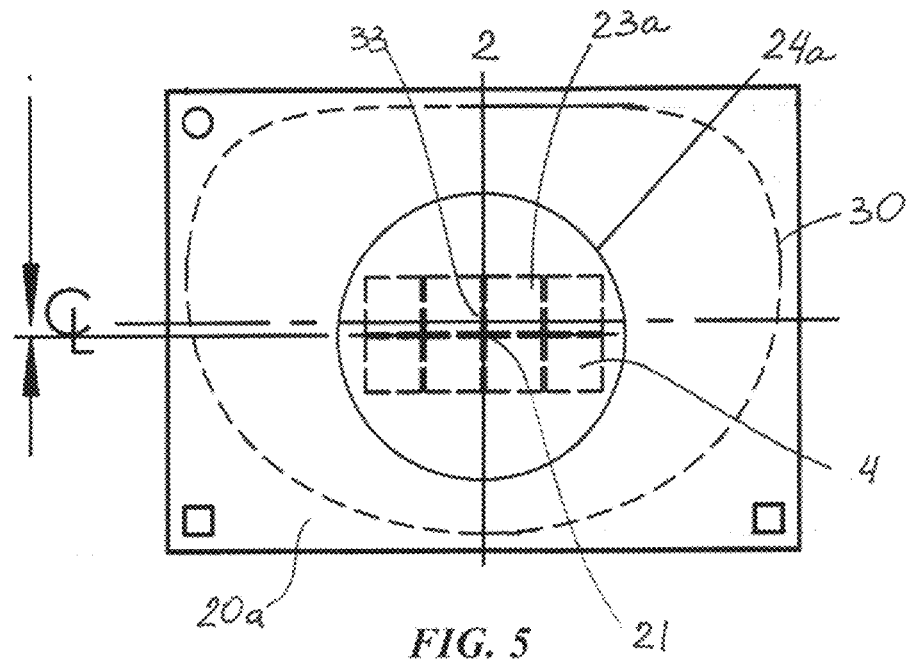
FIG. 5 is an enlarged plan view of the LED package of FIG. 3.
Figure 6:
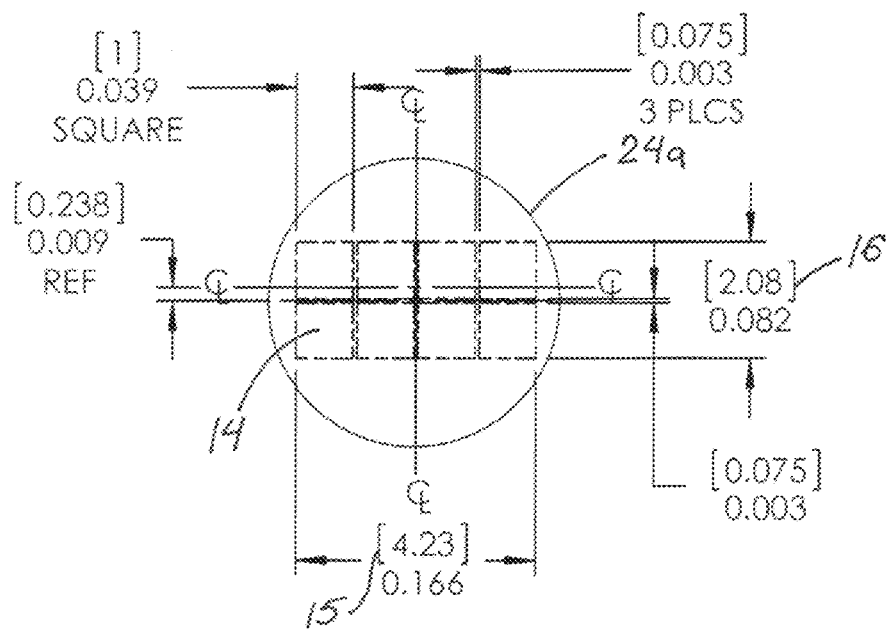
FIG. 6 is an enlarged plan view of the LED array of the LED package of FIG. 3 and showing main dimensions of the LED array.
Figure 10:
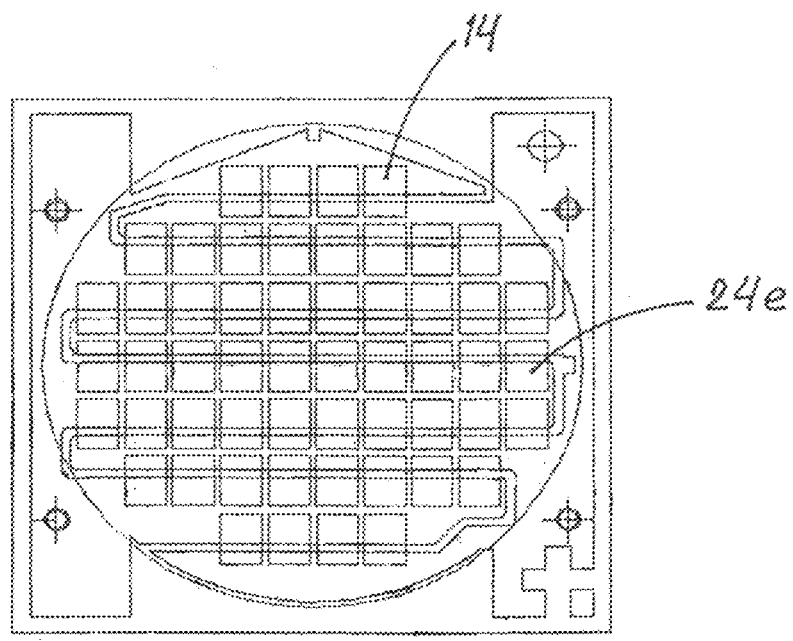
Figure 11:
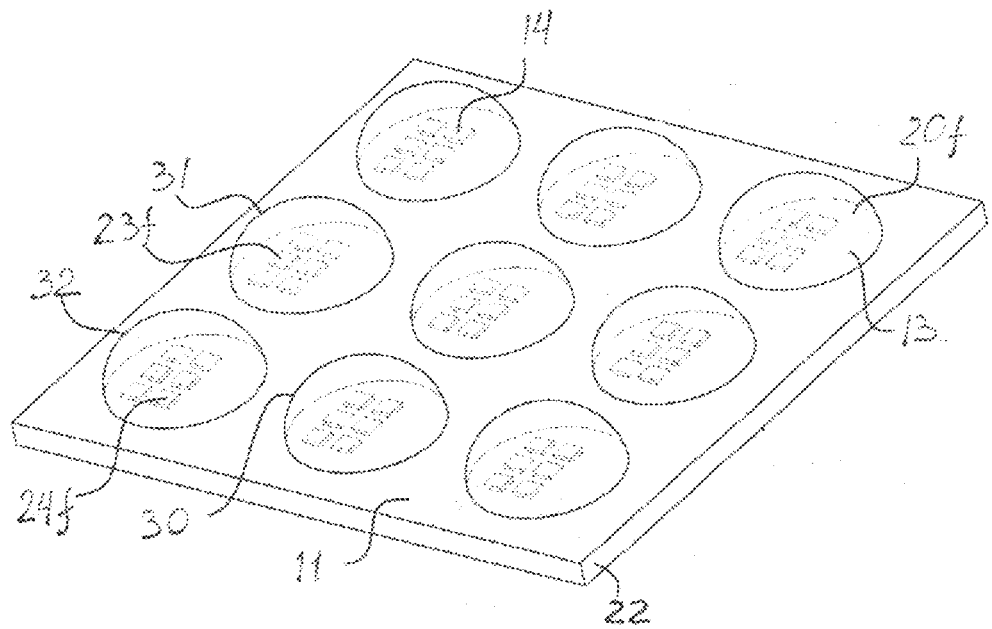
FIG. 11 is a perspective view of a plurality of LED light sources of this invention on a common submount.
Figure 12:
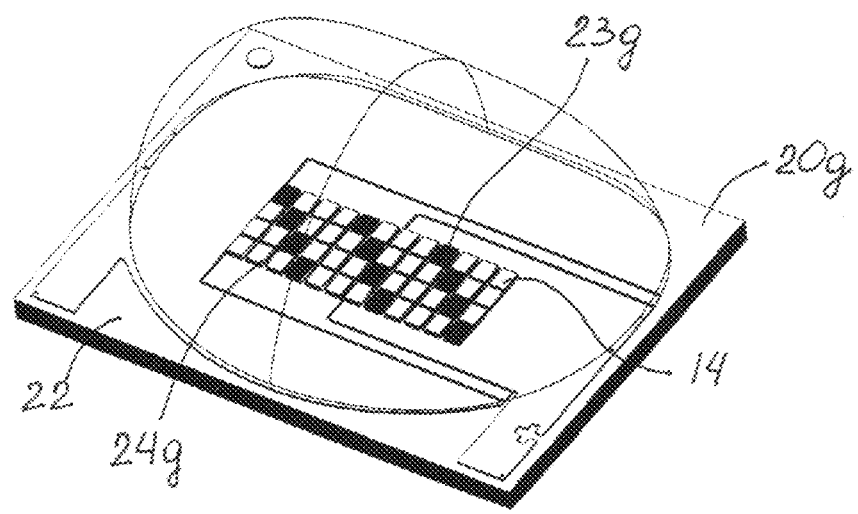
FIG. 12 is an enlarged perspective view of an embodiment of the inventive LED package including an array of forty-eight LEDs and an asymmetric primary lens overmolded over the LED array.

FIGS. 5-12 and 27 illustrate various configurations of LED-populated areas 23a-h with aspect ratios of at least about 1.25, at least about 1.5 and at least about 2. FIGS. 3-6 show LED emitter 20a including rectangular LED-populated area 23a with eight LEDs 14 arranged in two rows of four LEDs 14 in each row. In FIG. 6, dimensions are indicated in millimeters in brackets, the first maximum cross dimension being [2.08], i.e., 2.08 millimeters, and are indicated in inches under the brackets. FIG. 12 shows LED emitter 20g including forty-eight LEDs 14 arranged in four rows of twelve LEDs 14 in each row. The aspect ratios of LED-populated area 23a is about 2 and aspect ratio of LED-populated area 23g is about 3.

Figure 7:
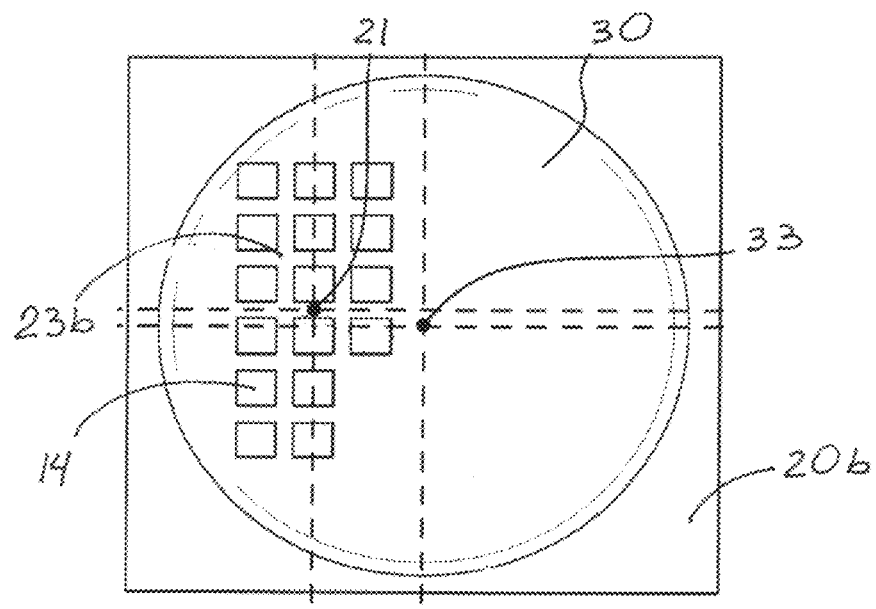
FIGS. 7 and 8 are enlarged plan views of alternative LED arrays according to the present invention and having asymmetric shapes.
Figure 8:
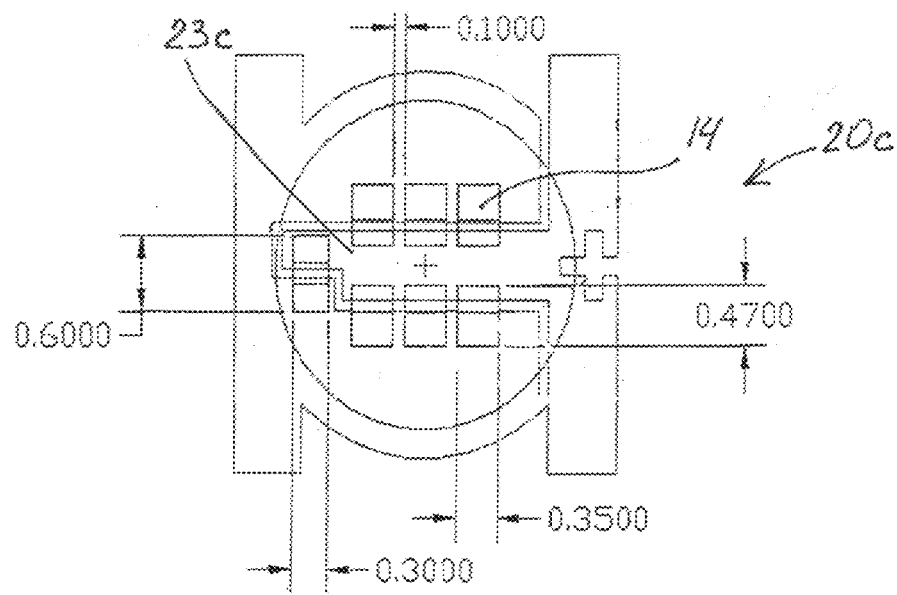

FIGS. 7 and 8 illustrate LED arrays 23b and 23c with LEDs 14 arranged in asymmetric configurations each having aspect ratio greater than 1.

Figure 27:
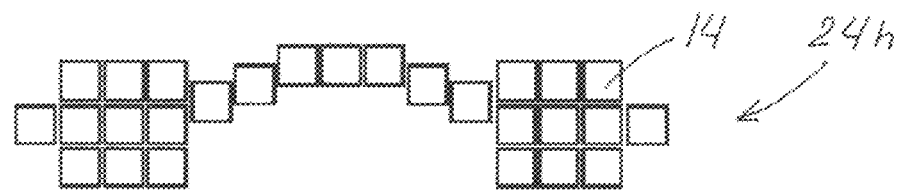
FIG. 27 is an enlarged plan view of still another alternative configuration of an LED array according to the present invention.
Figure 27A:
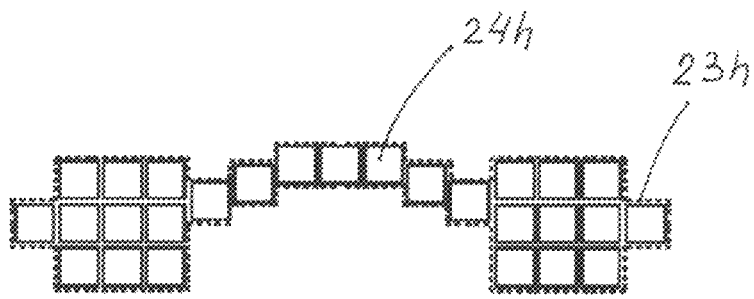
FIG. 27A is an exemplary illustration of outer boundaries of an LED-populated area of the LED array of FIG. 27.
Figure 27B:
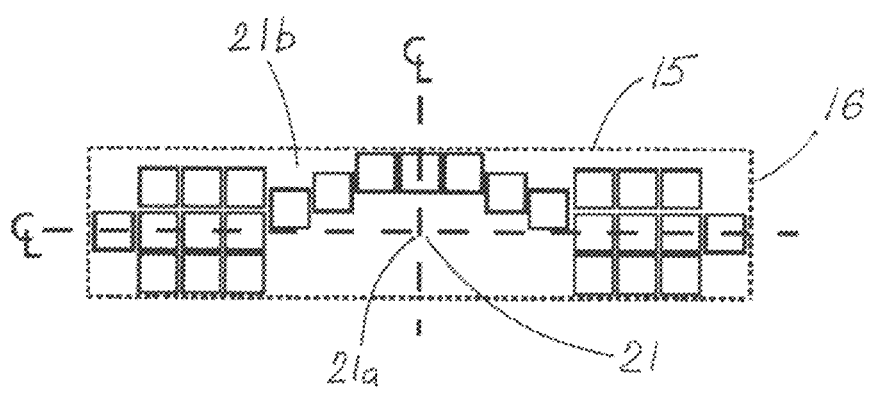
FIG. 27B is an exemplary illustration of location of an emitter axis of LED array of FIG. 27, and is an exemplary illustration of two orthogonal maximum cross-dimensions for the purpose of determination of an aspect ratio of an LED-populated area of FIG. 27A.

FIG. 27A illustrates an example of outer boundaries of LED-populated area 23h. FIG. 27B is an exemplary illustration of two orthogonal maximum cross-dimensions for the purpose of determination of an aspect ratio of a particular LED-populated area 23. FIG. 27B is also an exemplary illustration of a position of emitter axis 21 passing through geometric center 21a of minimum-area rectangle 21b bounding LED-populated area 23.

Figure 9:
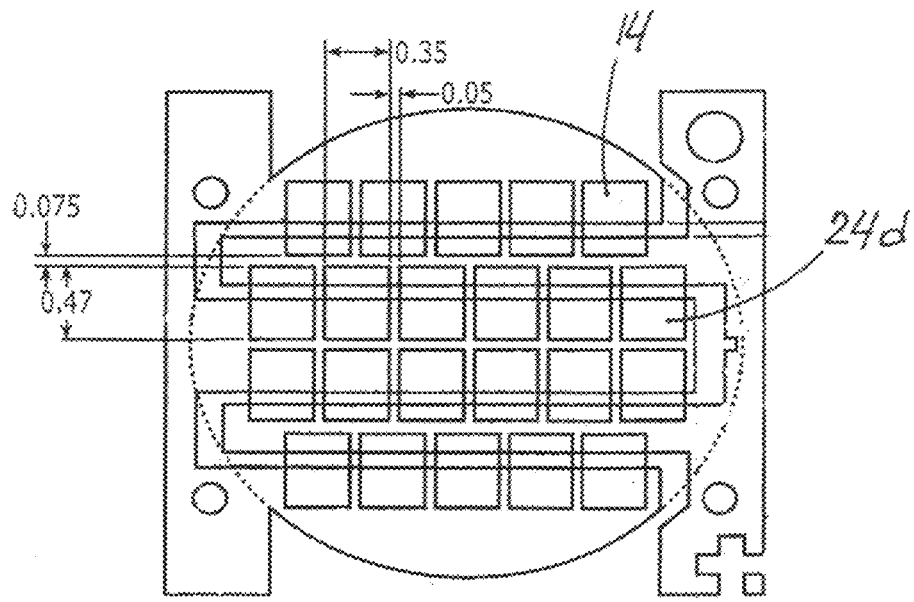
FIGS. 9 and 10 are enlarged plan views of yet more alternative LED arrays each configured according to the present invention.

FIGS. 6-10 also show that the spacing and arrangement of the LEDs 14 on each LED-populated area 23 is such that the total LED area is at least about one-third of LED-populated area 23, as seen in FIGS. 8 and 27. In FIG. 7, the spacing and arrangement of the LEDs 14 are such that the total LED area is at least about two-thirds of LED-populated area 23b. In FIGS. 6, 9 and 10, the spacing and arrangement of the LEDs 14 are such that the total LED area is at least about 90% of LED-populated areas 23a, 23d and 23e.

FIG. 8 shows the spacing between LEDs 14 of array 24c is about 0.1 mm. In FIG. 6, the spacing between LEDs 14 of array 24a is about 0.075 mm. And, in FIG. 9 the spacing between LEDs 14 of array 24d is about 0.05 mm.

FIG. 2 further illustrates another aspect of this invention which is lighting apparatus 100 which includes a plurality of LED arrays 24 spaced along a circuit board 11, a plurality of first lenses 30 each over a corresponding LED array 24, and a plurality of second lenses 40 each spaced over a corresponding one of first lenses 30.

FIG. 2 also shows each first lens configured to refract LED-emitted light toward preferential side 2 with outer surface 32 of each first lens 30 being shaped for refraction of LED-emitted light toward preferential side 2, as best shown in FIGS. 3 and 4, and having centerline 33 offset from corresponding light-emission axis 21 toward preferential side 2, as shown in FIGS. 4-6. In FIG. 2, each of LED emitters 20 is in the form of what is sometimes referred to as an LED package which includes LED array 24 on submount 22a and first lens 30 overmolded on submount 22a over its corresponding LED array 24. FIG. 2 further shows each of submounts 22a mounted on circuit board 11.

FIG. 11 illustrates a plurality of LED arrays 24 mounted on a common submount 22 and a plurality of first lenses 30 overmolded on submount 22 over a respective one of LED arrays 24.

FIGS. 2 and 13-18 show the plurality of second lenses as portions of a one-piece lensing member 44. One-piece lensing member 44 including a set of alignment protrusions 45 extending from a circuit-board-adjacent surface 46 of lensing member 44, best seen in FIGS. 2, 13 and 14. It is also seen in FIG. 2 that circuit board 11 has a set of alignment holes formed in an LED-supporting surface 13 of circuit board 11 complementary to set alignment protrusions 45. Alignment protrusions 45 and alignment holes are engaged to accurately align secondary lenses 40 over their corresponding primary lenses 30.

Figure 13:
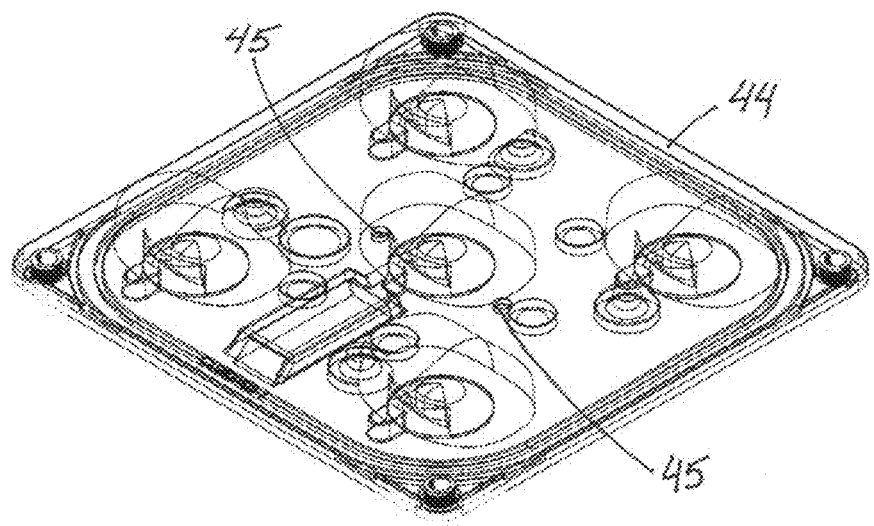
FIG. 13 is a transparent outer-surface perspective view of the single-piece lensing member of FIG. 2.
Figure 14:
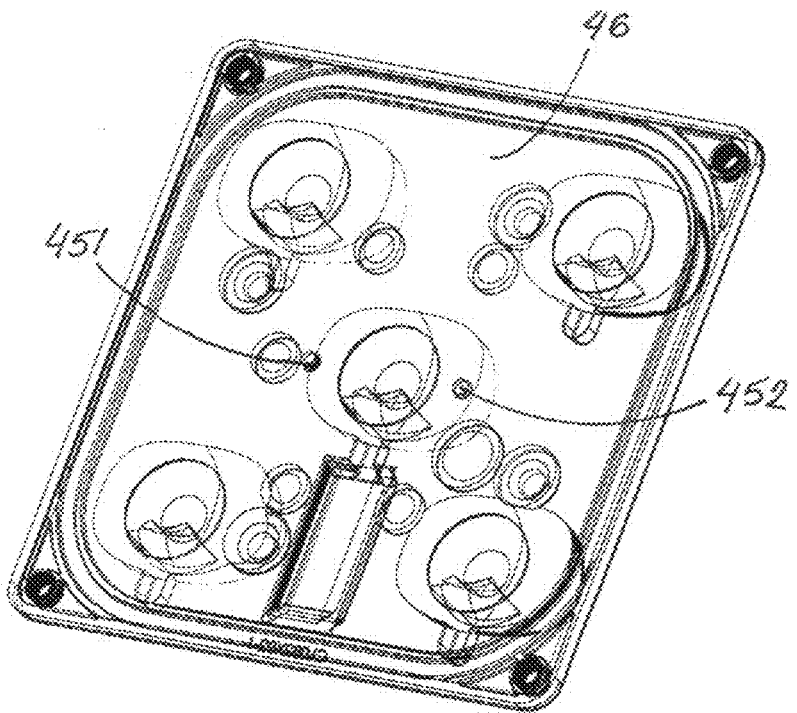
FIG. 14 is a transparent inner-surface perspective view of the single-piece lensing member of FIG. 13.
Figure 15:
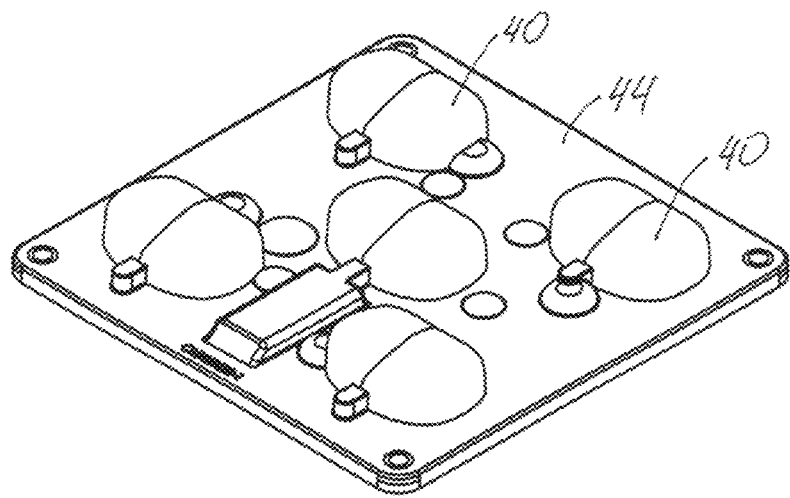
FIG. 15 is a non-transparent outer-surface perspective view of the single-piece lensing member of FIG. 13.
Figure 16:
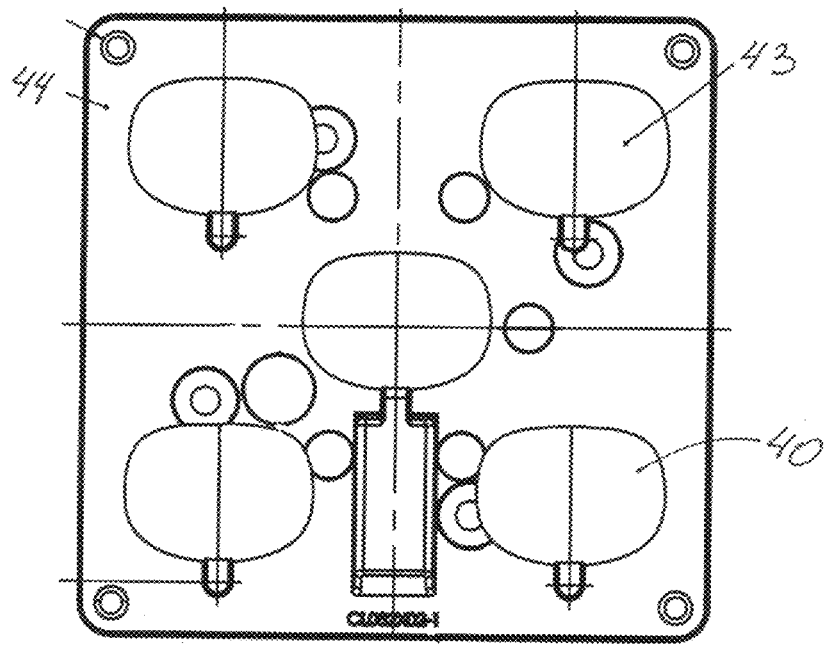
FIG. 16 is a non-transparent outer-surface plan view of the single-piece lensing member of FIG. 13.
Figure 17:
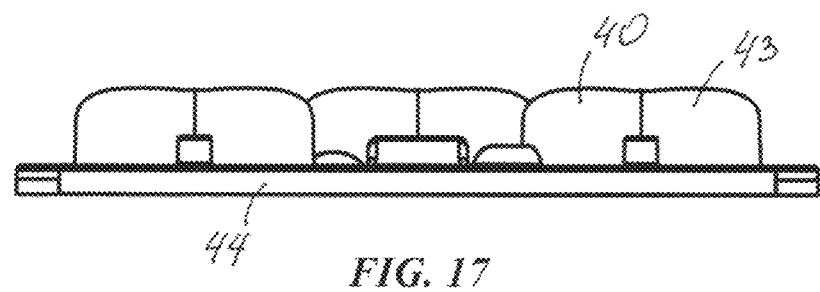
FIG. 17 is a non-transparent back view of the single-piece lensing member of FIG. 13.
Figure 18:
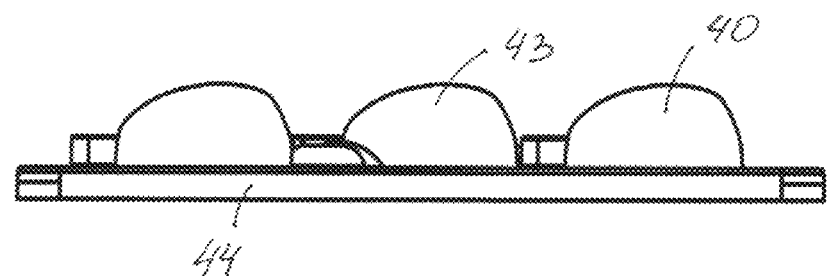
FIG. 18 is a non-transparent side view of the single-piece lensing member of FIG. 13.

It is also seen in FIGS. 2, 13 and 14 that protrusions 45 are first and second protrusions 451 and 452 extending from a circuit-board-adjacent surface 46 of lensing member 44, and that alignment holes defined by circuit board 11 are first and second holes 121 and 122. First hole 121 is complementary in shape to first protrusion 451 to fix the position of lensing member 44 along circuit board 11. Second hole 122 receives second protrusion 452 to prevent rotation of lensing member 44 about first protrusion 451. Second 122 hole is elongate along a line extending between first and second holes 121 and 122 which facilitates engagement of the alignment features 45 and 121.

Figure 20:
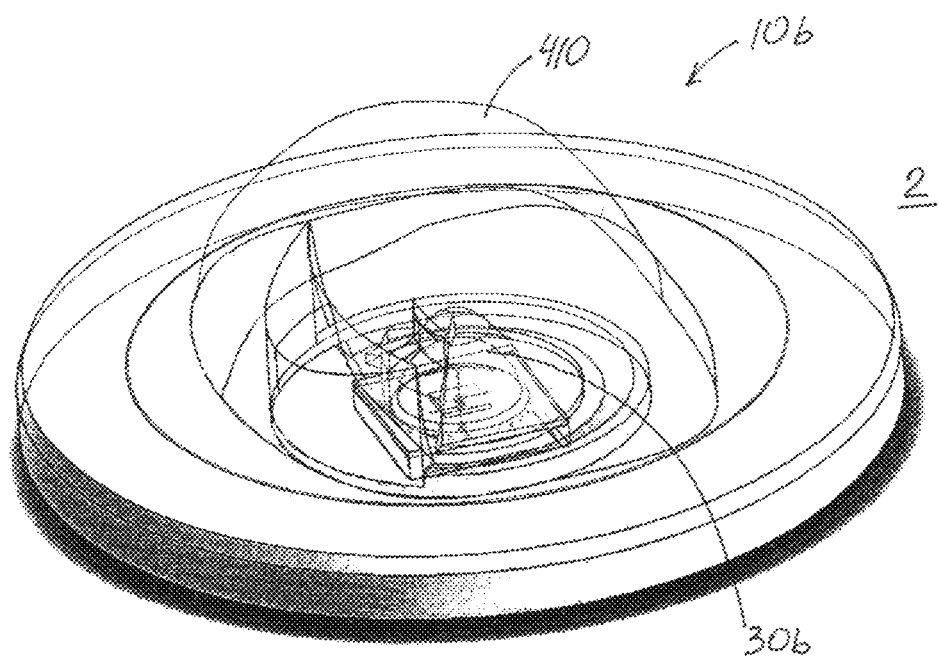
FIG. 20 is an enlarged perspective view of another embodiment of the inventive lighting apparatus including an inventive optical system with a hemispherical first optical surface and asymmetric second and third optical surfaces.
Figure 21:
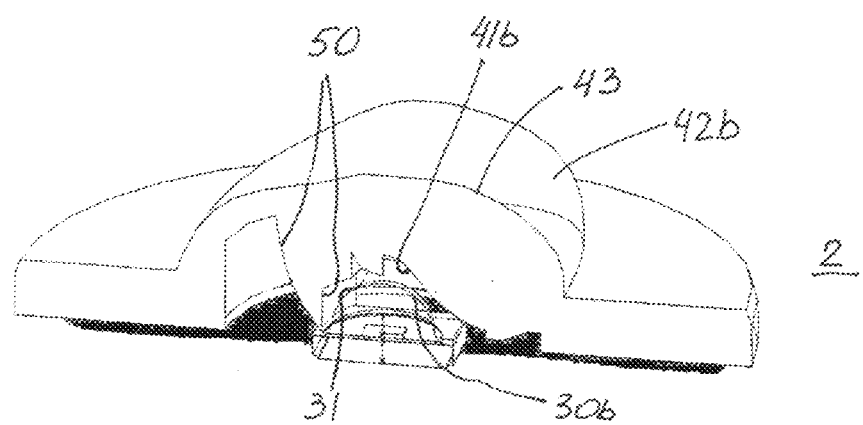
FIG. 21 is an enlarged non-transparent cross-sectional side view of the optical system of FIG. 20.
Figure 22:
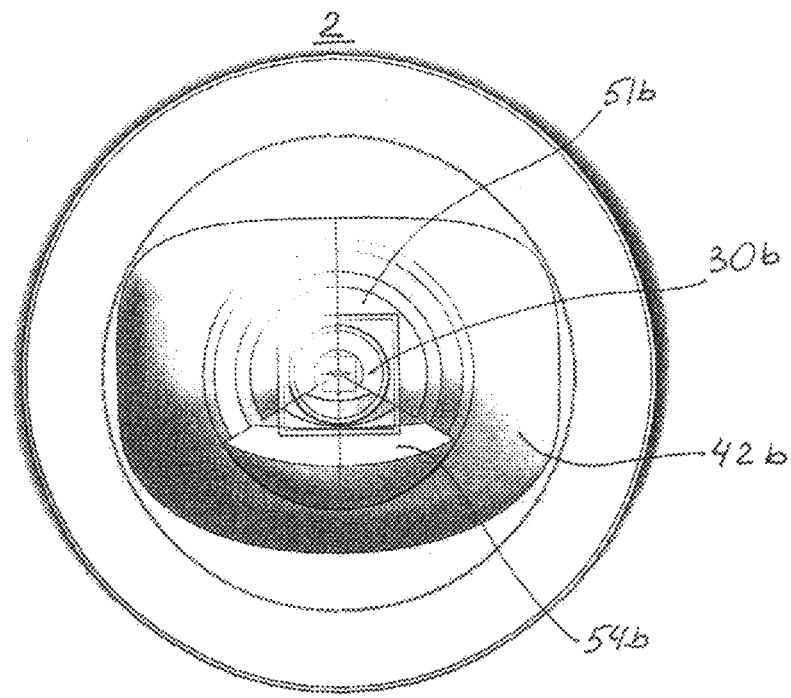
FIG. 22 is an enlarged transparent plan view of the lighting apparatus of FIG. 20.
Figure 23:
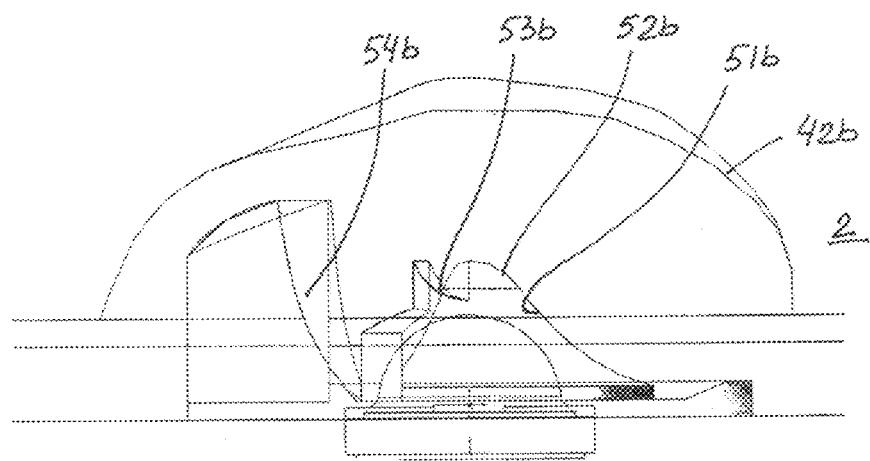
FIG. 23 is an enlarged transparent cross-sectional side view of the optical system of FIG. 20.

FIGS. 20-26 illustrate an alternative embodiment of lighting apparatus 10b which includes a hemispheric primary lens 30b and a separate-piece secondary lens 410 configured for refracting light from primary lens 30 toward preferential side 2 and creating an asymmetric illumination pattern such as type III or type IV light distribution patterns used for roadway lighting, as established by The Illumination Engineering Society (IES). Lens 410 has an inner surface 41b spaced from first optical surface 31b and has a refracting portion 51b and a reflecting portion 54b. FIGS. 20 and 22 best show refracting portion 51b surrounding first optical surface 31b and including front sector 52b and back sector 53b configured differently from one another. Reflecting portion 54b is around back sector 53b.

Figure 24:
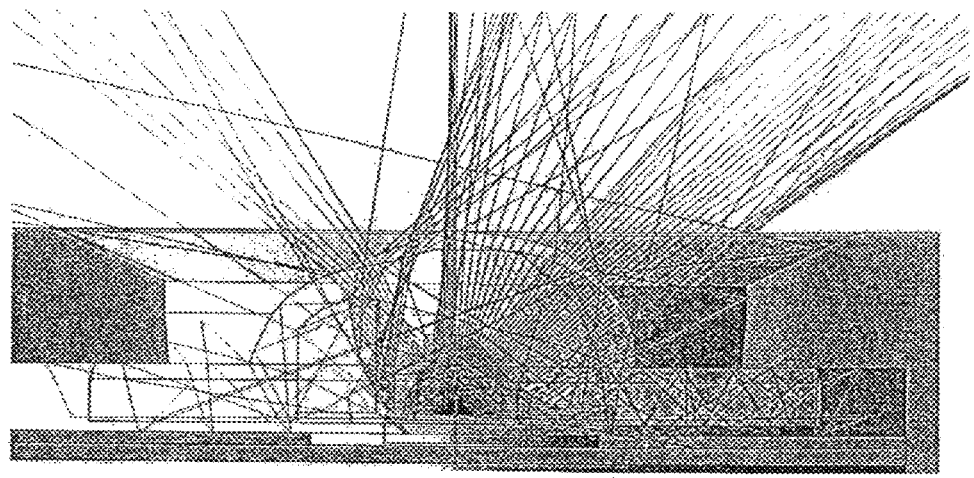
FIG. 24 is an enlarged cross-sectional side view of the lighting apparatus of FIG. 20 showing LED-light refraction toward the preferential side and the secondary lens as a separate piece.
Figure 25:
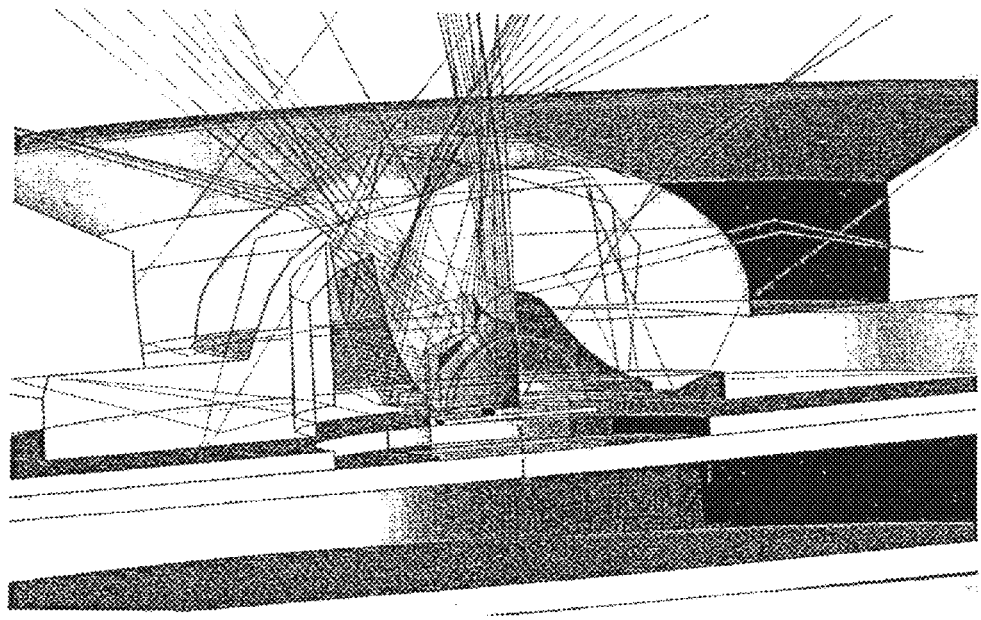
FIG. 25 is an enlarged cross-sectional perspective view of the lighting apparatus of FIG. 24 showing second-lens direction of LED light which is emitted toward a non-preferential side.
Figure 26:
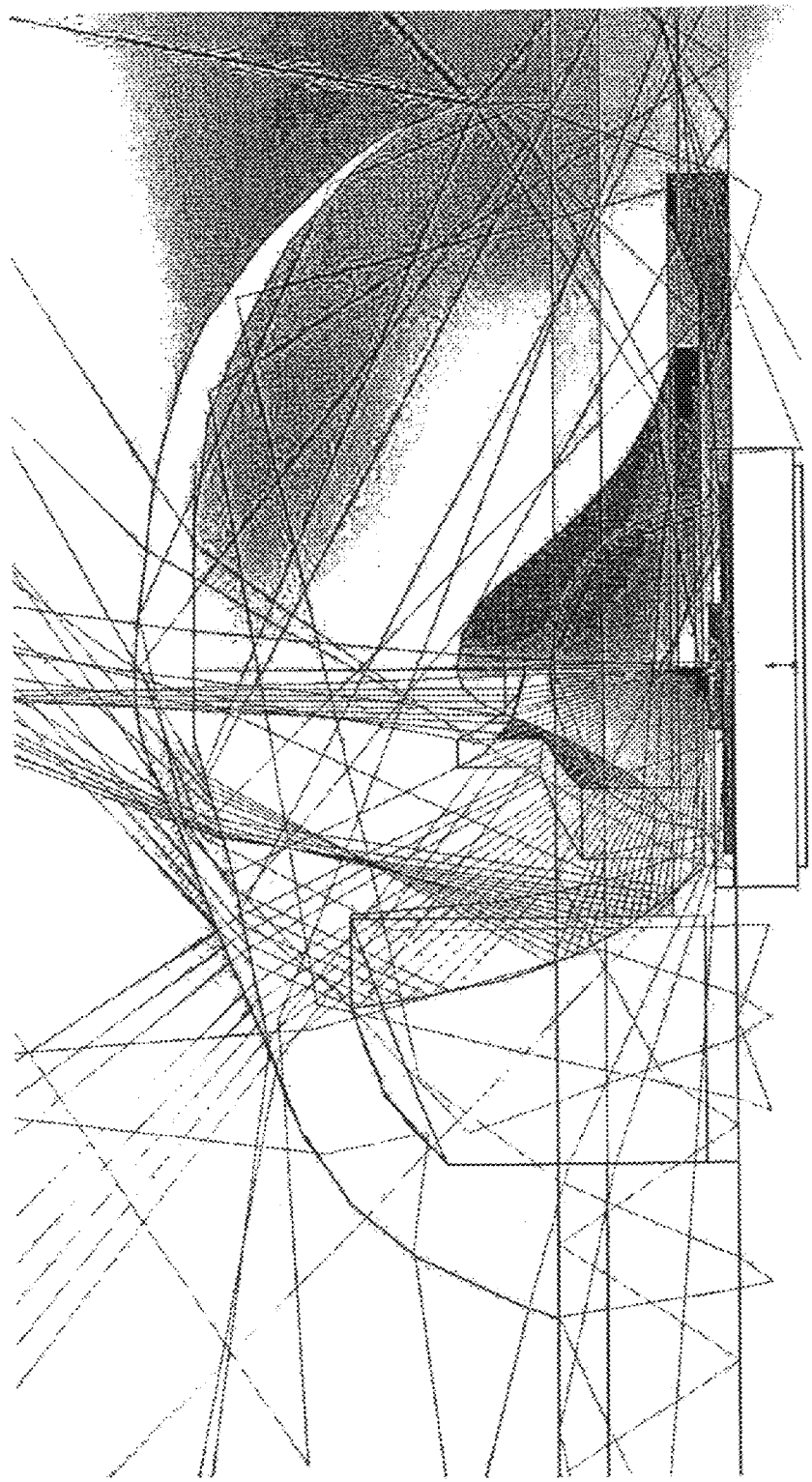
FIG. 26 is an enlarged fragmentary cross-sectional side view of the lighting apparatus of FIG. 25.

FIGS. 24-26 illustrate that reflecting portion 54b is positioned to receive light refracted by the back sector 53b for total internal reflection (TIR) toward outer surface 42b. It is seen in FIGS. 20, 24-26 that outer surface 42b is configured to further direct light from inner surface 41b toward preferential side. Lens 410 is described in more detail in the parent application Ser. No. 12/475,194, filed May 29, 2009, the contents of which are incorporated herein by reference.

FIGS. 1 and 19 best illustrate lighting apparatus 10 for preferential-side illumination with first lens 30 configured to direct LED-emitted light toward preferential side 2 and second lens 40 configured to further direct the light toward preferential side 2. Both first (or primary) lens 30 and second (or secondary) lens 40 are shown as having asymmetric shapes with preferential direction being a one side direction with respect to emitter axis 21.

Figure 32:
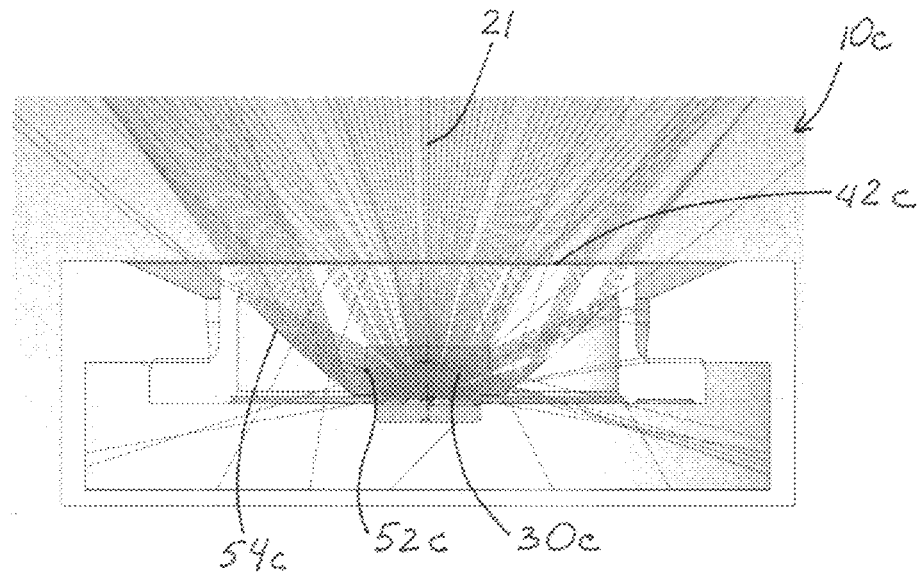
FIG. 32 is a front-to-back sectional view of the lens of FIG. 28 and illustrating forward and rearward light distributions.
Figure 33:
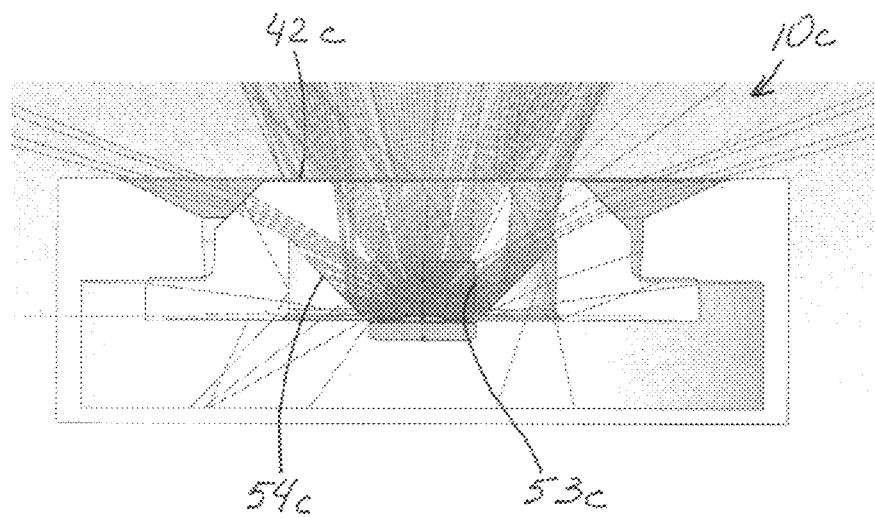
FIG. 33 is a side-to-side sectional view of the lens of FIG. 28 and illustrating lateral light distribution.
Figure 34:
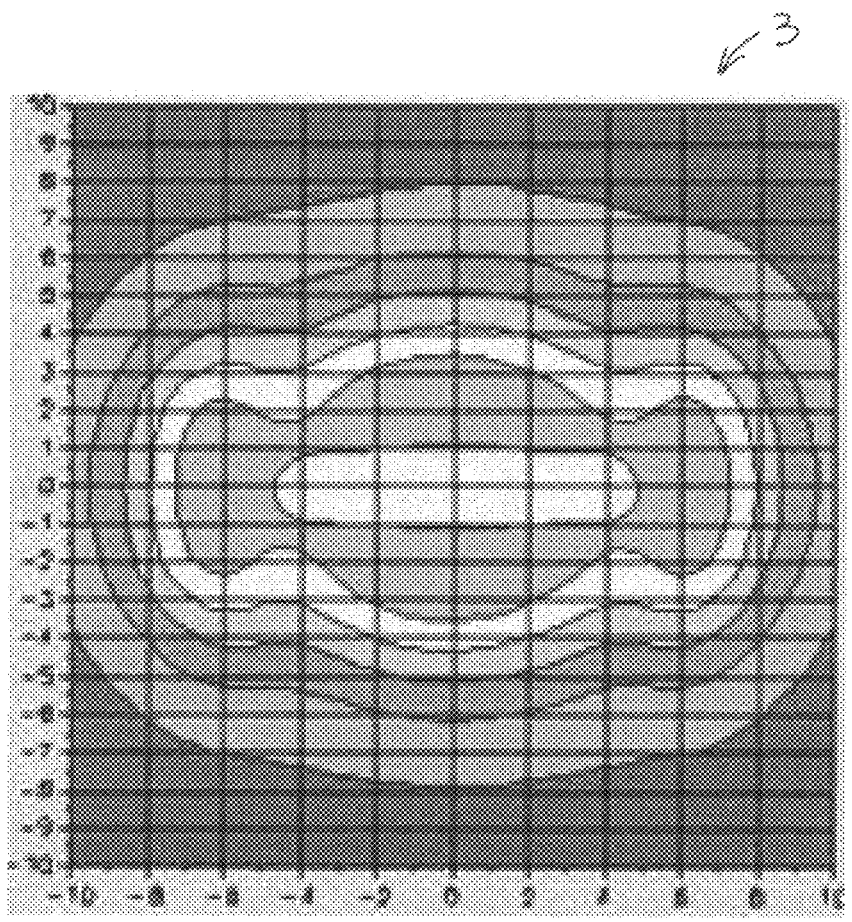
FIG. 34 is a two-dimensional ISO plot of illumination intensity distribution by the lens of FIG. 28 on an illuminated surface substantially normal to the emitter axis.
Figure 35:
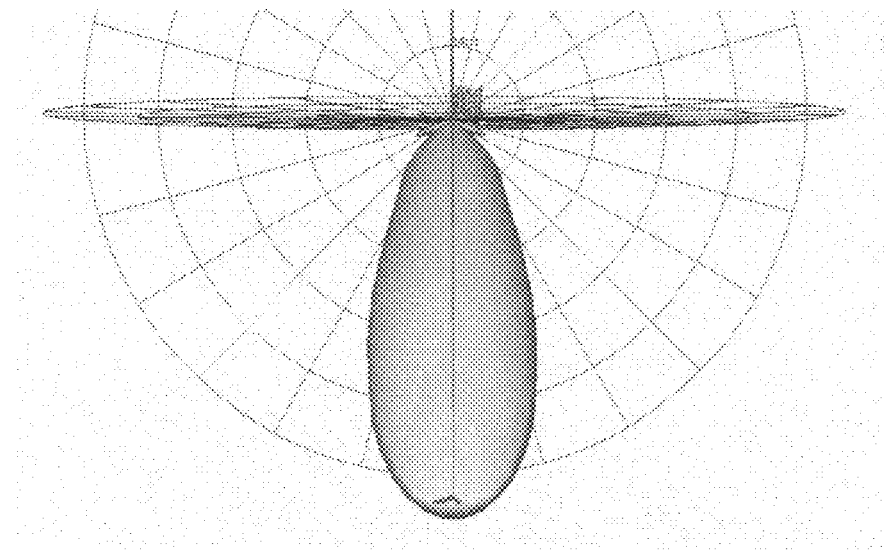
FIG. 35 is a polar intensity distribution in a plane which includes the emitter axis, illustrating light directed as shown in FIG. 33.
Figure 36:
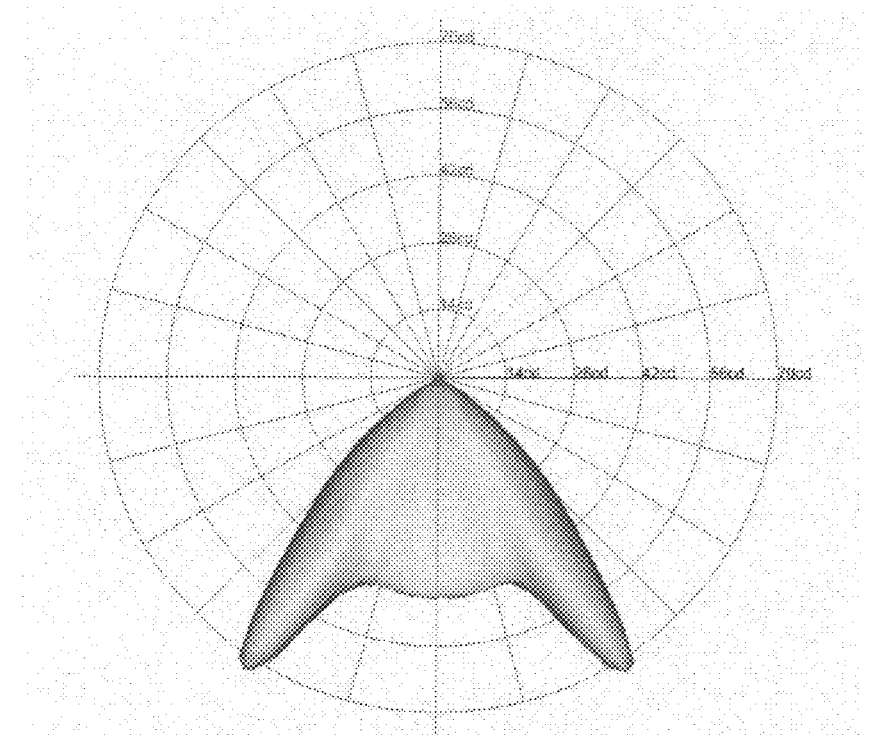
FIG. 36 is a polar intensity distribution in a plane which includes the emitter axis and is substantially orthogonal the plane of FIG. 35, illustrating light directed as shown in FIG. 32.

FIGS. 28-36 illustrate yet another alternative embodiment of lighting apparatus 10c with a separate-piece secondary lens 411 configured for directing a majority of light from primary lens 30c into an elongate distribution 3 with some lateral light along the sides of elongate distribution 3, as illustrated in FIGS. 34-36, such that preferential sides 2a are opposite sides along a longitudinal axial plane extending through emitter axis 21 and creating an non-rotationally symmetric elongate illumination pattern which is bilaterally symmetric in two main orthogonal directions. The illumination pattern produced by lens 411 is useful for tall elongate tassageways such as warehouse aisles. Lens 411 has an inner surface 41c spaced from primary lens surface 30c and has a refracting surface portion 51c and a reflecting surface portion 54c.

Figure 28:
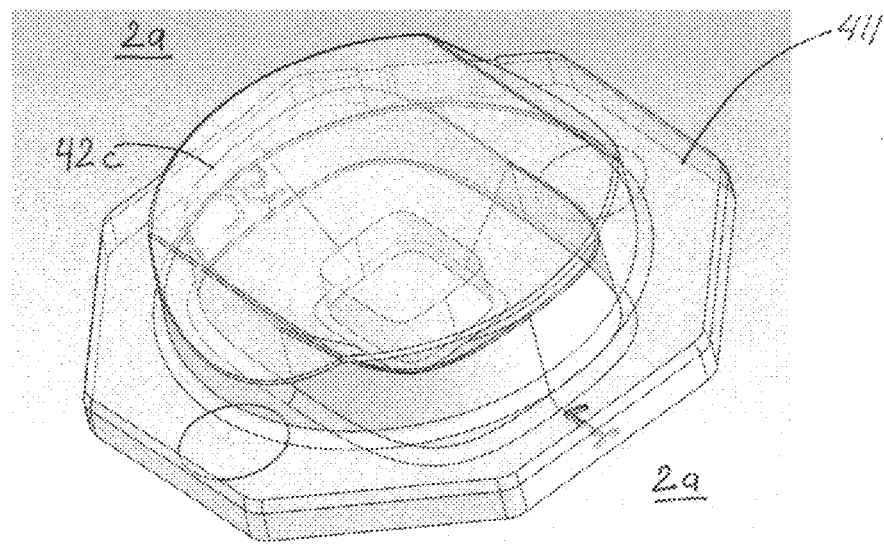
FIG. 28 is a transparent outer-surface perspective view of an alternative embodiment of the secondary lens.
Figure 29:
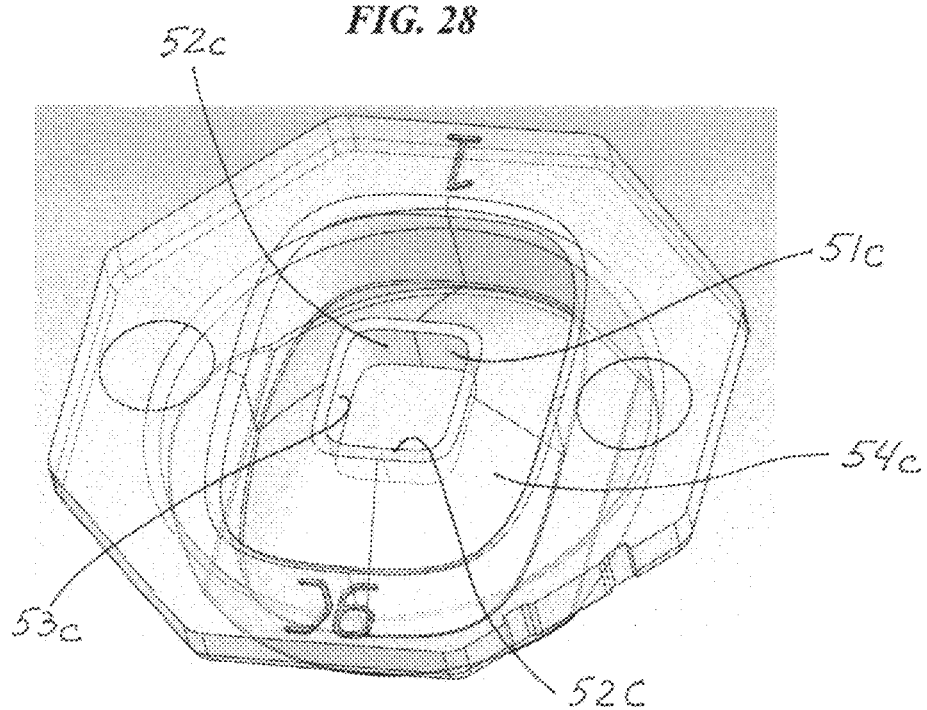
FIG. 29 is a transparent inner-surface perspective view of the secondary lens of FIG. 28.
Figure 30:
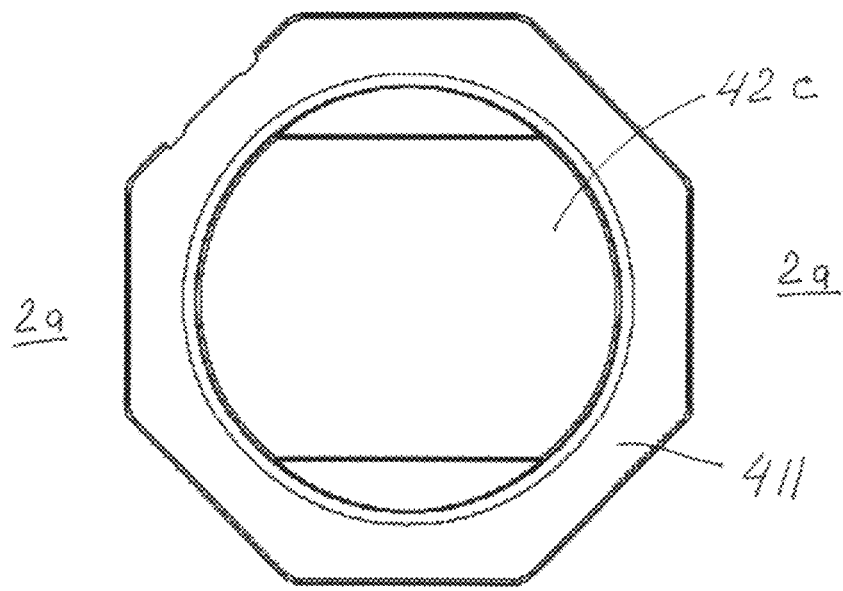
FIG. 30 is a non-transparent outer-surface plan view of the lens of FIG. 28.
Figure 31:
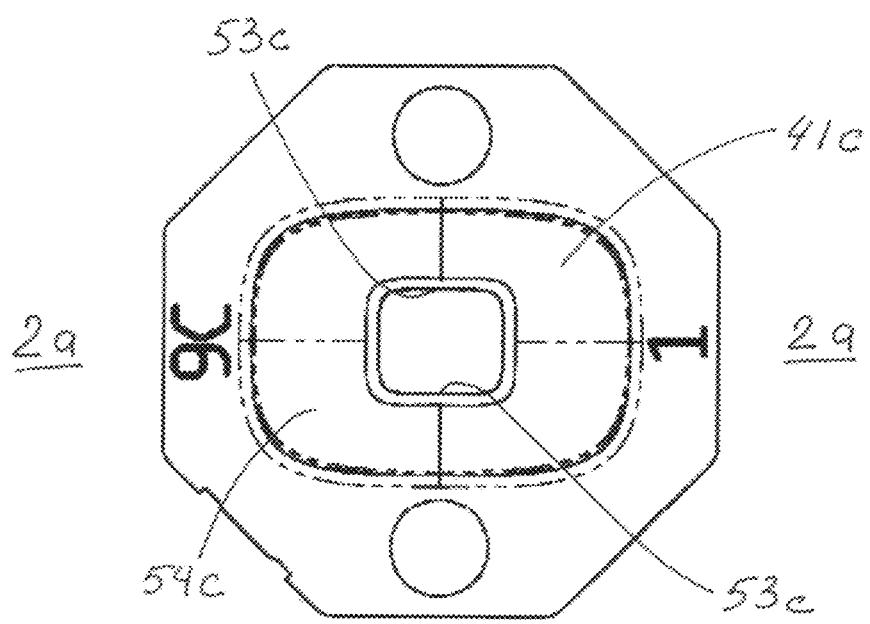
FIG. 31 is a non-transparent inner-surface plan view of the secondary lens of FIG. 28.

FIGS. 28, 29 and 31 best show refracting portion 51c surrounding primary lens 30c and including front and back portions 52c and a pair of opposite lateral portions 53c, front and back portions 52c being substantially orthogonal to and extending between lateral portions 52c. Reflecting portion 54c substantially surrounds refracting surface portion 51c.

FIGS. 32 and 33 illustrate that reflecting portion 54c is positioned to receive substantially all forward and rearward light (best shown in FIG. 32) and a portion of lateral light (best shown in FIG. 33). Reflective surface portion 54c is configured for total internal reflection (TIR) of the received light toward outer surface 42c. It is also seen in FIGS. 32 and 33 that outer surface 42c receives light from refracting inner surface 51c and from reflecting surface 54c and forms elongate light distribution 3 (shown in FIGS. 34-36) by refracting such received light. Lens 411 is described in more detail in application Ser. No. 13/408,882, filed Feb. 29, 2012, the contents of which are incorporated herein by reference.

While the principles of the invention have been shown and described in connection with specific embodiments, it is to be understood that such embodiments are by way of example and are not limiting.

The invention claimed is:

1. A lighting apparatus for preferential-side illumination from an LED light emitter having an axis, the apparatus having a first lens over the emitter and a second lens over the first lens, the apparatus comprising:
a first optical surface which is a first-lens outer surface configured to refract light from the emitter;
a second optical surface which is a second-lens inner surface spaced from the first optical surface and which includes:
a refracting portion surrounding the first optical surface and including front and back sectors configured differently from one another; and
a reflecting portion around the back sector, the reflecting portion positioned to receive light refracted by the back sector for total internal reflection (TIR) toward the preferential side; and
a third optical surface which is a second-lens outer surface configured to refract light from the second optical surface toward the preferential side.

2. The lighting apparatus of claim 1 wherein the first lens is configured such that the first optical surface refracts LED-emitted light toward the preferential side.

3. The lighting apparatus of claim 2 wherein the first optical surface is shaped for refraction of LED-emitted light toward the preferential side.

4. The lighting apparatus of claim 2 wherein the first optical surface has a centerline which is offset from the emitter axis toward the preferential side.

5. The lighting apparatus of claim 4 wherein the first optical surface is shaped for refraction of LED-emitted light toward the preferential side.

6. The lighting apparatus of claim 1 wherein the front sector of the refracting portion of the second optical surface has a substantially smooth surface configuration extending to the juncture of the front and back sectors.

7. The lighting apparatus of claim 6 wherein the back sector of the refracting portion of the second optical surface includes at least a pair of surface portions transverse to each other.

8. The lighting apparatus of claim 1 wherein the back sector of the refracting portion of the second optical surface includes at least a pair of surface portions transverse to each other.

9. The lighting apparatus of claim 1 wherein:
the emitter includes an LED light source which includes a submount having an LED-populated area which has an aspect ratio greater than 1, and an array of LEDs on the LED-populated area; and
the first lens is on the submount over the LED-populated area.

10. The lighting apparatus of claim 9 wherein the aspect ratio is at least about 1.25.

11. The lighting apparatus of claim 10 wherein the aspect ratio is at least about 1.5.

12. The lighting apparatus of claim 11 wherein the aspect ratio is at least about 2.

13. The lighting apparatus of claim 9 wherein the LED-populated area is rectangular.

14. The lighting apparatus of claim 1 comprising:
a plurality of arrays of light-emitting diodes (LEDs) spaced along a circuit board;
a plurality of the first lenses each over a corresponding array of LEDs, each first lens having the first-lens outer surface configured to refract light from its corresponding LED array; and
a plurality of the second lenses each spaced over a corresponding one of the first lenses, each second lens having:
the second-lens inner surface configured to direct light toward the preferential side from its corresponding first-lens outer surface; and
the second-lens outer surface configured to refract light toward the preferential side from the inner surface.

15. The lighting apparatus of claim 14 wherein each first lens refracts LED-emitted light toward the preferential side.

16. The lighting apparatus of claim 15 wherein each first lens is shaped for refraction of LED-emitted light toward the preferential side.

17. The lighting apparatus of claim 15 wherein the outer surface of each first lens has a centerline which is offset from the corresponding light-emission axis toward the preferential side.

18. The lighting apparatus of claim 17 wherein the outer surface of each first lens directs LED-emitted light toward the preferential side.

19. The LED light source of claim 14 wherein each first lens is overmolded over each LED array.

20. The lighting apparatus of claim 14 wherein each LED array defines a light-emission axis and has first and second maximum cross-dimensions orthogonal to one another, the first cross-dimension being greater than the second cross-dimension.

21. The lighting apparatus of claim 20 wherein the back sector of the refracting portion of each second-lens inner surface includes at least a pair of surface portions transverse to each other.

22. The lighting apparatus of claim 20 wherein the front sector of the refracting portion of each second-lens inner surface has a substantially smooth surface configuration extending to the juncture of the front and back sectors.

23. The lighting apparatus of claim 14 wherein the plurality of LED arrays are mounted on a common submount.

24. The lighting apparatus of claim 14 wherein each LED array is on a submount and each of the submounts is mounted on the circuit board.

25. The lighting apparatus of claim 14 wherein the plurality of second lenses are portions of a one-piece lensing member.

26. The lighting apparatus of claim 14 wherein the ratio of the first maximum cross-dimension to the second maximum cross-dimension of each LED array is at least about 1.25.

27. The lighting apparatus of claim 26 wherein the ratio is at least about 1.5.

28. The lighting apparatus of claim 27 wherein the ratio is at least about 2.

29. The lighting apparatus of claim 14 wherein each LED array occupies an LED-populated area with the spacing and arrangement of the LEDs being such that the total LED area is at least about one-third of the LED-populated area.

30. The lighting apparatus of claim 29 wherein the spacing and arrangement of the LEDs are such that the total LED area is at least about two-thirds of the LED-populated area.

31. The lighting apparatus of claim 30 wherein the spacing and arrangement of the LEDs are such that the total LED area at least about 90% of the LED-populated area.

32. The lighting apparatus of claim 29 wherein the spacing between LEDs is no more than about 1 millimeter.

33. The lighting apparatus of claim 32 wherein the spacing between LEDs is no more than about 0.5 millimeters.

34. The lighting apparatus of claim 33 wherein the spacing between LEDs is no more than about 0.1 millimeters.

35. The lighting apparatus of claim 34 wherein the spacing between LEDs is no more than about 0.075 millimeters.

36. The lighting apparatus of claim 35 wherein the spacing between the LEDs is no more than about 0.05 millimeters.

37. A lighting apparatus comprising:
an LED light source including a submount having an array of LEDs defining an LED-populated area which has an aspect ratio greater than 1 with first and second maximum cross-dimensions orthogonal to one another where the first cross-dimension is greater than the second cross-dimension;

a first lens on the submount over the LED array and having an outer surface configured to refract light from the LED array; and a second lens spaced over the first lens, the second lens having an inner surface and an outer surface which is configured to refract light from the inner surface.

38. The LED light source of claim 37 wherein the first lens is overmolded on the submount.

39. The lighting apparatus of claim 37 wherein:
the LED array defines a light-emission axis;
the inner surface of the second lens includes:
a refracting portion surrounding the first lens; and
a reflecting portion positioned to receive light refracted by the refracting portion for total internal reflection (TIR) of such light toward the second-lens outer surface.

40. The lighting apparatus of claim 39 wherein the refracting portion of the second-lens inner surface includes front and back sectors configured differently from one another.

41. The lighting apparatus of claim 40 wherein the reflecting portion partially surrounds the refracting portion to receive light refracted by the back sector, the front sector refracting light toward the outer surface.

42. The lighting apparatus of claim 37 wherein the spacing and arrangement of the LEDs are such that the total LED area is at least about one-third of the LED-populated area.

43. The lighting apparatus of claim 42 wherein the spacing and arrangement of the LEDs are such that the total LED area is at least about two-thirds of the LED-populated area.

44. The lighting apparatus of claim 43 wherein the spacing and arrangement of the LEDs are such that the total LED area is about 90% of the LED-populated area.

45. The lighting apparatus of claim 42 wherein the spacing between LEDs is no more than about 0.1 millimeters.

46. The lighting apparatus of claim 45 wherein the spacing between LEDs is no more than about 0.075 millimeters.

47. The lighting apparatus of claim 46 wherein the spacing between the LEDs is no more than about 0.05 millimeters.

48. The lighting apparatus of claim 37 wherein the aspect ratio is at least about 1.25.

49. The lighting apparatus of claim 48 wherein the aspect ratio is at least about 1.5.

50. The lighting apparatus of claim 49 wherein the aspect ratio is at least about 2.

51. The lighting apparatus of claim 37 wherein the LED-populated area is rectangular.

52. The lighting apparatus of claim 37 comprising:
a plurality of arrays of light-emitting diodes (LEDs) spaced along a circuit board, each array having first and second maximum cross-dimensions orthogonal to one another, the first maximum cross-dimension being greater than the second maximum cross-dimension, and each LED array defining a light-emission axis;
a plurality of the first lenses each over a corresponding array of LEDs, each first lens having an outer surface configured to refract light from its corresponding LED array; and
a plurality of the second lenses each spaced over a corresponding one of the first lenses, each second lens having an inner surface and an outer surface which is configured to refract light from the inner surface.

53. The lighting apparatus of claim 52 wherein the plurality of LED arrays are mounted on a common submount.

54. The lighting apparatus of claim 52 wherein each LED array is on a submount and each of the submounts is mounted on the circuit board.

55. The LED light source of claim 52 wherein each first lens is overmolded over each LED array.

56. The lighting apparatus of claim 52 wherein the ratio of the first maximum cross-dimension to the second maximum cross-dimension of each LED array is at least about 1.25.

57. The lighting apparatus of claim 56 wherein the ratio is at least about 1.5.

58. The lighting apparatus of claim 57 wherein the ratio is at least about 2.

59. The lighting apparatus of claim 52 wherein each LED array has a rectangular configuration.

60. The lighting apparatus of claim 52 wherein each LED array occupies an LED-populated area with the spacing and arrangement of the LEDs being such that the total LED area is at least about one-third of the LED-populated area.

61. The lighting apparatus of claim 60 wherein the spacing and arrangement of the LEDs are such that the total LED area is at least about two-thirds of the LED-populated area.

62. The lighting apparatus of claim 61 wherein the spacing and arrangement of the LEDs are such that the total LED area is about 90% of the LED-populated area.

63. The lighting apparatus of claim 60 wherein the spacing between LEDs is no more than about 1 millimeter.

64. The lighting apparatus of claim 63 wherein the spacing between LEDs is no more than about 0.5 millimeters.

65. The lighting apparatus of claim 64 wherein the spacing between LEDs is no more than about 0.1 millimeters.

66. The lighting apparatus of claim 65 wherein the spacing between LEDs is no more than about 0.075 millimeters.

67. The lighting apparatus of claim 66 wherein the spacing between the LEDs is no more than about 0.05 millimeters.

68. The lighting apparatus of claim 52 wherein the plurality of the second lenses are portions of a one-piece lensing member.

69. The lighting apparatus of claim 37 comprising:
a plurality of arrays of light-emitting diodes (LEDs) spaced along a circuit board, each array having first and second maximum cross-dimensions orthogonal to one another, the first maximum cross-dimension being greater than the second maximum cross-dimension, and each LED array defining a light-emission axis; and
a plurality of the first and second lenses each over a corresponding array of LEDs, each lens having an outer surface configured to refract light from its corresponding LED array.

70. The lighting apparatus of claim 69 wherein the plurality of LED arrays are mounted on a common submount.

71. The lighting apparatus of claim 69 wherein each LED array is on a submount and each of the submounts is mounted on the circuit board.

72. The lighting apparatus of claim 69 wherein each lens is configured to direct LED-emitted light toward a preferential side.

73. The lighting apparatus of claim 72 wherein each lens has a centerline which is offset from the corresponding light-emission axis toward the preferential side.

74. The lighting apparatus of claim 73 wherein each lens has an outer surface configured to direct LED-emitted light toward the preferential side.

75. The lighting apparatus of claim 72 wherein each second lens has:
an inner surface configured to direct light toward the preferential side from the first-lens outer surface; and an outer surface configured to refract light toward the preferential side from the inner surface.

76. The LED light source of claim 73 wherein each first lens is overmolded over each LED array.

77. The lighting apparatus of claim 75 wherein the inner surface of each second lens includes:
   a refracting portion surrounding the first lens and including front and back sectors configured differently from one another; and
   a reflecting portion around the back sector, the reflecting portion positioned to receive light refracted by the back sector for total internal reflection (TIR) toward the preferential side.

78. The lighting apparatus of claim 77 wherein the back sector of the refracting portion includes at least a pair of surface portions transverse to each other.

79. The lighting apparatus of claim 78 wherein the front sector of the refracting portion of the second lens has a substantially smooth surface configuration extending to the juncture of the front and back sectors.

80. The lighting apparatus of claim 75 wherein the plurality of second lenses are portions of a one-piece lensing member.

81. The lighting apparatus of claim 69 wherein:
   the plurality of first lenses are primary lenses each over a corresponding LED array;
   the plurality of second lenses are portions of a one-piece lensing member over the circuit board and including a plurality of secondary lenses each spaced over a corresponding one of the primary lenses.

82. The lighting apparatus of claim 69 wherein the ratio of the first maximum cross-dimension to the second maximum cross-dimension is at least about 1.25.

83. The lighting apparatus of claim 82 wherein the ratio is at least about 1.5.

84. The lighting apparatus of claim 83 wherein the ratio is at least about 2.

\* \* \* \* \*